United States Patent
Horio et al.

(10) Patent No.: US 8,502,219 B2
(45) Date of Patent: Aug. 6, 2013

(54) METHOD FOR GROWING ZINC-OXIDE-BASED SEMICONDUCTOR DEVICE AND METHOD FOR MANUFACTURING SEMICONDUCTOR LIGHT EMITTING DEVICE

(75) Inventors: Naochika Horio, Tokyo (JP); Masayuki Makishima, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 470 days.

(21) Appl. No.: 12/784,732

(22) Filed: May 21, 2010

(65) Prior Publication Data

US 2010/0295040 A1    Nov. 25, 2010

(30) Foreign Application Priority Data

May 25, 2009   (JP) .................................. 2009-125495

(51) Int. Cl.
*H01L 29/88* (2006.01)

(52) U.S. Cl.
USPC .................................... 257/43; 257/E33.019

(58) Field of Classification Search
USPC ............................ 257/43, E33.019; 438/104
See application file for complete search history.

(56) References Cited

U.S. PATENT DOCUMENTS

| | | | |
|---|---|---|---|
| 6,624,441 B2 * | 9/2003 | Cantwell et al. ................ | 257/43 |
| 6,673,478 B2 | 1/2004 | Kato et al. | |
| 7,964,868 B2 | 6/2011 | Nakagawa et al. | |
| 2006/0170013 A1 * | 8/2006 | Kato et al. .................... | 257/252 |
| 2009/0044745 A1 | 2/2009 | Sekiwa et al. | |
| 2009/0087940 A1 | 4/2009 | Kushiya | |
| 2009/0256148 A1 * | 10/2009 | Park et al. ....................... | 257/43 |
| 2009/0267062 A1 * | 10/2009 | Nakahara et al. .............. | 257/43 |
| 2010/0230671 A1 | 9/2010 | Nakahara et al. | |
| 2010/0295039 A1 | 11/2010 | Horio et al. | |

FOREIGN PATENT DOCUMENTS

| | | | |
|---|---|---|---|
| JP | 2004-296821 A | | 10/2004 |
| JP | 2004296821 | * | 10/2004 |
| JP | 2005-302940 A | | 10/2005 |
| JP | 2006-73726 A | | 3/2006 |
| JP | 2006073726 | * | 3/2006 |
| JP | 2007-73672 A | | 3/2007 |
| JP | 2009-78959 A | | 4/2009 |

OTHER PUBLICATIONS

Shunri et al (Japanese Journal of applied Physics,vol. 24,No. 12, Dec. 1985,pp. 1607-1610).*

(Continued)

*Primary Examiner* — Matthew W Such
*Assistant Examiner* — Ali Naraghi
(74) *Attorney, Agent, or Firm* — Holtz, Holtz, Goodman & Chick, P.C.

(57) ABSTRACT

A method which has a low-temperature growth step of growing a buffer layer of a ZnO-based single crystal on the substrate at a growth temperature in the range of 250° C. to 450° C. using a polar oxygen material and a metalorganic compound containing no oxygen; performing a heat treatment of the buffer layer to effect a transition of the buffer layer to a thermostable-state single crystal layer; and a high-temperature growth step of growing the ZnO-based single crystal layer on the thermostable-state single crystal layer at a growth temperature in the range of 600° C. to 900° C. using a polar oxygen material and a metalorganic compound containing no oxygen.

19 Claims, 16 Drawing Sheets

OTHER PUBLICATIONS

U.S. Appl. No. 12/784,704, filed May 21, 2010, Inventors: Naochika Horio, et al; entitled: Method for Growing Zinc-Oxide-Based Semiconductor Device and . . . .

Hiroyuki Kato et al.: "High-quality ZnO epilayers grown on Zn-face Zn-O substrates by plasma assisted molecular beam epitaxy": Journal of Crystal Growth 265 (2004): pp. 375-381.

M. W. Cho et al.: "Issues in ZnO homoepitaxy": Superlattices and Microstructures: 38 (2005): pp. 349-363.

Japanese Office Action dated Jan. 29, 2013 (and English translation thereof) in counterpart Japanese Application No. 2009-125495.

* cited by examiner

FIG.7

| | GROWTH PROCESS | | PROPERTIES OF GROWTH LAYER | | | |
|---|---|---|---|---|---|---|
| | SUBSTRATE TREATMENT | BUFFER LAYER FORMATION | SURFACE MORPHOLOGY | (002) 2θ | (100) ω FWHM | IMPURITIES (SIMS) |
| FIRST EMBODIMENT <EMB1> | BOILING CLEANING | PRESENT (Tbuf=400°C) | FLAT (MIRROR PLANE) | TWO PEAKS (SHIFT TO HIGH-ANGLE SIDE) | 180 arcsec | · INTERFACIAL PILEUP · DIFFUSION INTO GROWTH LAYER |
| SECOND EMBODIMENT <EMB1> | ETCHING | PRESENT (Tbuf=400°C) | FLAT (MIRROR PLANE) | SINGLE PEAK | 26 arcsec | · INTERFACIAL PILEUP · DIFFUSION INTO GROWTH LAYER |
| THIRD EMBODIMENT <EMB1> | ETCHING | PRESENT (Tbuf=300°C) | FLAT (MIRROR PLANE) | SINGLE PEAK | 28.5 arcsec | · INTERFACIAL PILEUP · DIFFUSION INTO GROWTH LAYER |
| COMPARATIVE EXAMPLE <CMP> | BOILING CLEANING | ABSENT | FOLDED IRREGULAR | SINGLE PEAK | 120 arcsec | — (UNMEASURABLE) |

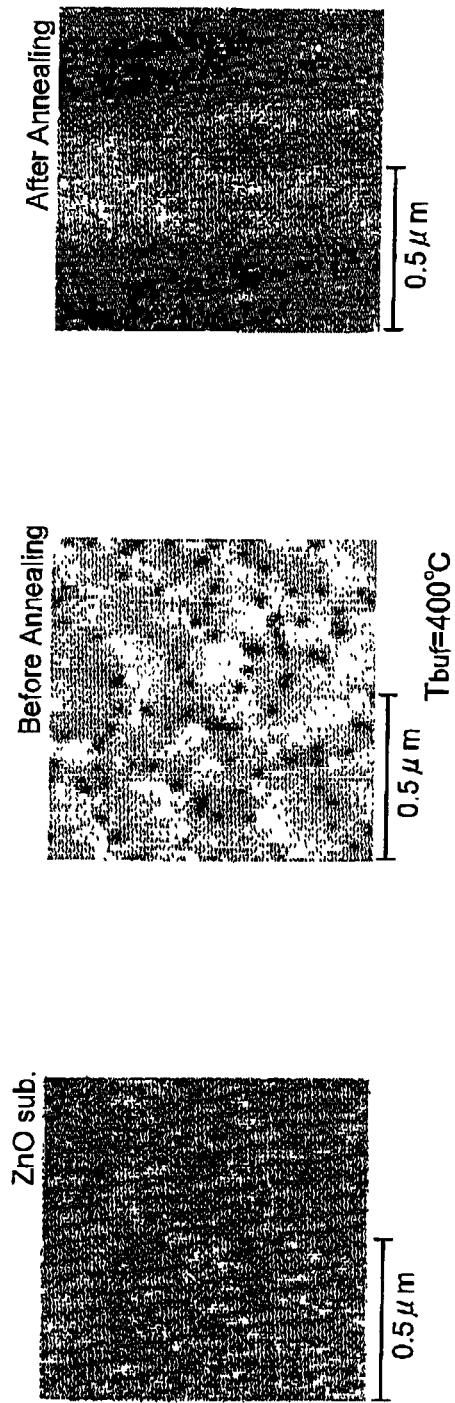

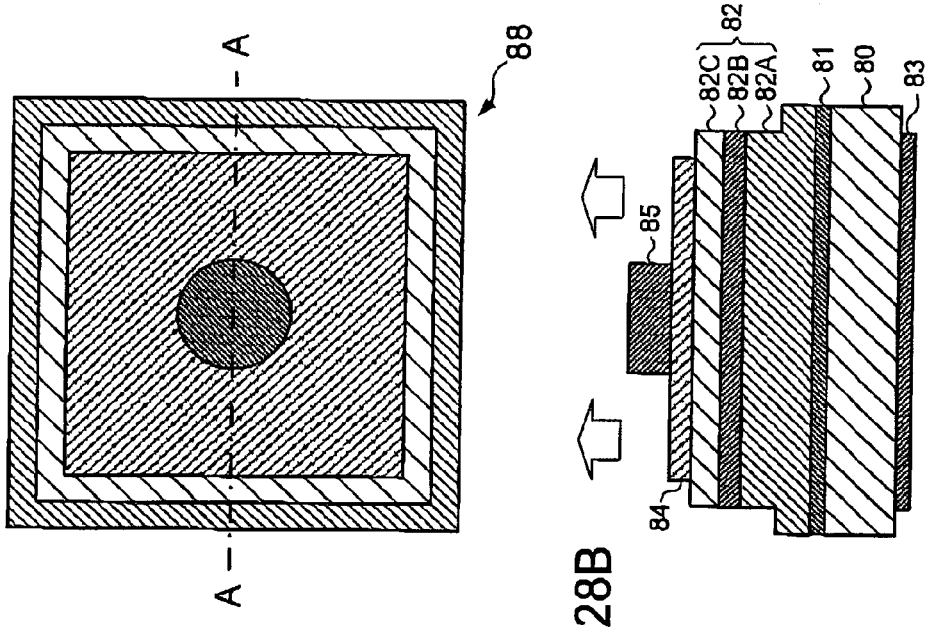
FIG.28A
FIG.28B
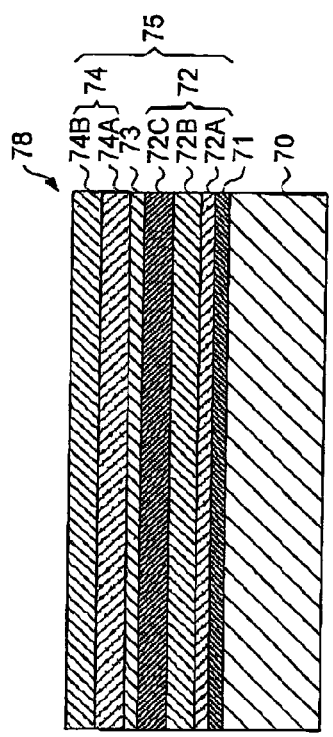
FIG.27

METHOD FOR GROWING ZINC-OXIDE-BASED SEMICONDUCTOR DEVICE AND METHOD FOR MANUFACTURING SEMICONDUCTOR LIGHT EMITTING DEVICE

BACKGROUND OF THE INVENTION

1. Technical Field

The present invention relates to a method for growing a zinc-oxide-based semiconductor device and a method for manufacturing a semiconductor device, and more particularly to a method for growing a zinc-oxide-based semiconductor layer on a ZnO substrate and a method for manufacturing a zinc-oxide-based semiconductor light emitting device based on an MOCVD method.

2. Description of the Related Art

A zinc oxide (ZnO) is a direct transition type semiconductor having band gap energy of 3.37 eV at a room temperature, and it is expected as a material for a photoelectronic device in a blue or ultraviolet region. In particular, it has physical properties very suitable for a semiconductor light emitting device, i.e., an exciton binding energy of 60 meV and a refractive index n=2.0. Further, the zinc oxide can be employed for a wide range of devices including surface-acoustic wave (SAW) devices, piezoelectric devices, and the like. Moreover, ZnO as a raw material has the advantages that it is inexpensive and is not harmful to the environment and human bodies.

In general, as a crystal growth method for a zinc-oxide-based compound semiconductor device, an MOCVD (Metal Organic Chemical Vapor Deposition) method, an MBE (Molecular Beam Epitaxy) method, or a PLD (Pulsed Laser Deposition) method is utilized. The MBE method is a crystal growth method in an ultrahigh vacuum, and it has problems that an apparatus is expensive and productivity is low. On the other hand, the MOCVD method has advantages that an apparatus is relatively inexpensive, large-area growth and/or simultaneous multiple-wafer growth is possible, a throughput is high, and the method is excellent in mass productivity or a cost.

Meanwhile, in a conventional single-crystal growth technology for a group-III-V-based compound semiconductor, single-crystal growth can be readily performed on a substrate of the same type of single-crystal. However, utilizing the MOCVD method to directly grow a zinc-oxide-based single crystal (which will be also referred to as a ZnO-based single crystal hereinafter) on a ZnO single crystal substrate was difficult.

More specifically, even if the MOCVD method is utilized to grow a ZnO-based single crystal layer on a ZnO single crystal substrate at a high temperature of, e.g., approximately more than 500° C., a crystal layer having granular, whisker-like, rod-like or disc-like crystals or aggregation thereof is apt to be produced. Moreover, even if a single crystal is grown, the crystal layer is formed to have many regions where crystal axes thereof are slightly deviated from each other. As described above, there was a problem that a high-quality ZnO-based single crystal layer having excellent flatness and crystal orientation could not be grown on a ZnO substrate at a high temperature.

On the other hand, a manufacture problem of a ZnO substrate used for crystal growth is pointed out. For example, impurities contained in an ingot (i.e., a bulk single crystal) manufactured by, for example, a hydrothermal method and present on a substrate surface generate defects or dislocations in an epitaxial growth layer, or a mechanical damage introduced in a substrate slicing process and remaining on the substrate surface generates a defect or dislocation in the epitaxial growth layer (e.g., a Japanese Patent Publication No. 4045499 (which will be referred to as Patent Document 1 hereinafter).

To avoid such problems, a method for performing crystal growth by using a buffer layer is carried out (e.g., the Patent Document 1 and a Japanese Patent Application Laid-open No. 2006-73726 (which will be also referred to as Patent Document 2 hereinafter)). More specifically, in the MOCVD method, there is adopted a so-called buffer layer technology. In this technology, a ZnO crystal is grown on a ZnO single crystal substrate at a growth temperature lower than a temperature for growing a ZnO single crystal, e.g., a low temperature less than 500° C. to form a flat and dense amorphous or particulate polycrystal and a heat treatment is performed at a high temperature of approximately 500° C. or above to restore crystallinity or crystalline quality.

Moreover, development of a method for growing a crystal close to an ideal crystal that has less crystal defects and has excellent flatness and crystal orientation is very important to achieve high performance and high reliability of a semiconductor device using a ZnO-based crystal. In particular, to manufacture a semiconductor light emitting device using the ZnO-based crystal, an n-type ZnO-based crystal layer that enables efficient injection of electrons into a light-emission layer, the light-emission layer having a high light-emission efficiency, a p-type ZnO-based crystal layer that enables efficient injection of holes into the light-emission layer are required. To obtain the respective layers of the semiconductor light emitting device, a crystal growth technology that can achieve a ZnO-based crystal having excellent flatness and crystal orientation and a low density of defects (i.e., Zn deficiency, oxygen deficiency, complex defects) or dislocation (screw dislocation, edge dislocation) must be established.

SUMMARY OF THE INVENTION

The present invention is intended to solve a problem that a crystal layer having sufficient flatness and orientation cannot be grown according to the conventional buffer layer technology even though a ZnO-based crystal is grown on a buffer layer at a high temperature. In more detail, the applicant recognized that the following problems are present in the buffer layer technology and the present invention is directed to solve such problems. Specifically, the applicant recognized that the crystallinity of a buffer layer cannot be sufficiently restored even though a heat treatment is performed if the buffer layer is of an amorphous state, a polycrystal state or a single-crystal state having poor flatness at the stage of formation of the buffer layer, and a high-quality ZnO-based crystal having excellent flatness and crystal orientation cannot be grown on the buffer layer.

It is an object of the present invention to provide a method for forming a buffer layer that is superior in flatness and crystal orientation and has an excellent buffer function or capability on a ZnO single crystal substrate and forming a thermostable-state ZnO single crystal that is superior in flatness and crystal orientation and has a low defect and dislocation density and high integrity on the buffer layer. Further, it is another object of the present invention to provide a semiconductor device having high performance and high reliability, especially a semiconductor light emitting device that is superior in a light emitting efficiency and a device life duration and has high performance. Furthermore, it is still another object of the present invention to provide a semiconductor light emitting device that has a high fabrication yield and excellent mass productivity.

According to one aspect of the present invention, there is provided a method for growing a ZnO-based crystal layer on a substrate of a zinc oxide (ZnO) single crystal by an MOCVD method, the method includes:

a low-temperature growth step of growing a buffer layer of a ZnO-based single crystal on the substrate at a growth temperature in the range of 250° C. to 450° C. using a polar oxygen material and a metalorganic compound containing no oxygen;

a step of performing a heat treatment of the buffer layer to effect a transition of the buffer layer to a thermostable-state single crystal layer; and a high-temperature growth step of growing a ZnO-based single crystal layer on the thermostable-state single crystal layer at a growth temperature in the range of 600° C. to 900° C. using a polar oxygen material and a metalorganic compound containing no oxygen.

According to another aspect of the present invention, there is provided a semiconductor device manufactured by forming ZnO-based semiconductor layers on a substrate of a ZnO single crystal by an MOCVD method, the semiconductor device includes:

a buffer layer grown on the substrate at a growth temperature in the range of 250° C. to 450° C. using a polar oxygen material and a metalorganic compound containing no oxygen, the buffer layer being subject to a heat treatment after growth to effect a transition of the buffer layer to a thermostable-state single crystal layer;

a ZnO-based semiconductor layer grown on the buffer layer at a growth temperature in the range of 600° C. to 900° C. using a polar oxygen material and a metalorganic compound containing no oxygen, and a device layer grown on the ZnO-based semiconductor layer, the device layer including at least one of an n-type ZnO-based semiconductor layer and a p-type ZnO-based semiconductor layer.

According to further another aspect of the present invention, there is provided a ZnO-based single-crystal-layer-formed substrate, which includes:

a ZnO-based single crystal substrate containing at least one of Al, Li and Si as an impurity at a predetermined concentration; and a buffer layer grown on the substrate, the buffer layer being a thermostable-state ZnO-based single crystal layer, wherein the buffer layer produces solid solution with the impurity when measurement is performed based on SIMS (secondary ion mass spectroscopy); and a concentration of the impurity in the ZnO-based single crystal layer is lower than the predetermined concentration when measurement is performed based on the SIMS.

BRIEF DESCRIPTION OF THE DRAWINGS

FIG. 7 is a list of growth processes and evaluation results of respective crystal growth layers according to the first to third embodiments of the invention and the comparative example;

FIG. 19 shows an AFM image of a surface of a ZnO substrate;

FIG. 20 shows an AFM image of a buffer layer surface grown based on a method according to the second embodiment of the invention;

FIG. 21 shows an AFM image of the surface of the buffer layer shown in FIG. 20 after annealing (900° C., 10 min);

FIG. 27 is a cross-sectional view showing a layered structure of a device-layer-formed substrate for use in manufacture of a ZnO-based semiconductor light emitting device (LED);

FIGS. 28A and 28B are a top view and a cross-sectional view of a semiconductor light emitting diode (LED)

DETAILED DESCRIPTION OF THE INVENTION

First Embodiment

A method for growing a zinc-oxide(ZnO)-based semiconductor crystal layer having excellent single-crystallinity and flatness on a ZnO single crystal substrate based on the MOCVD method will now be described hereinafter in detail with reference to the accompanying drawings. Further, comparative examples for describing characteristics, configurations and effects of a growth method and a growth layer according to the embodiments will also be described in detail. Furthermore, as a semiconductor device formed based on the growth method according to the present invention, a semiconductor light emitting diode (LED) will be taken as an example to be described.

Figure 1:
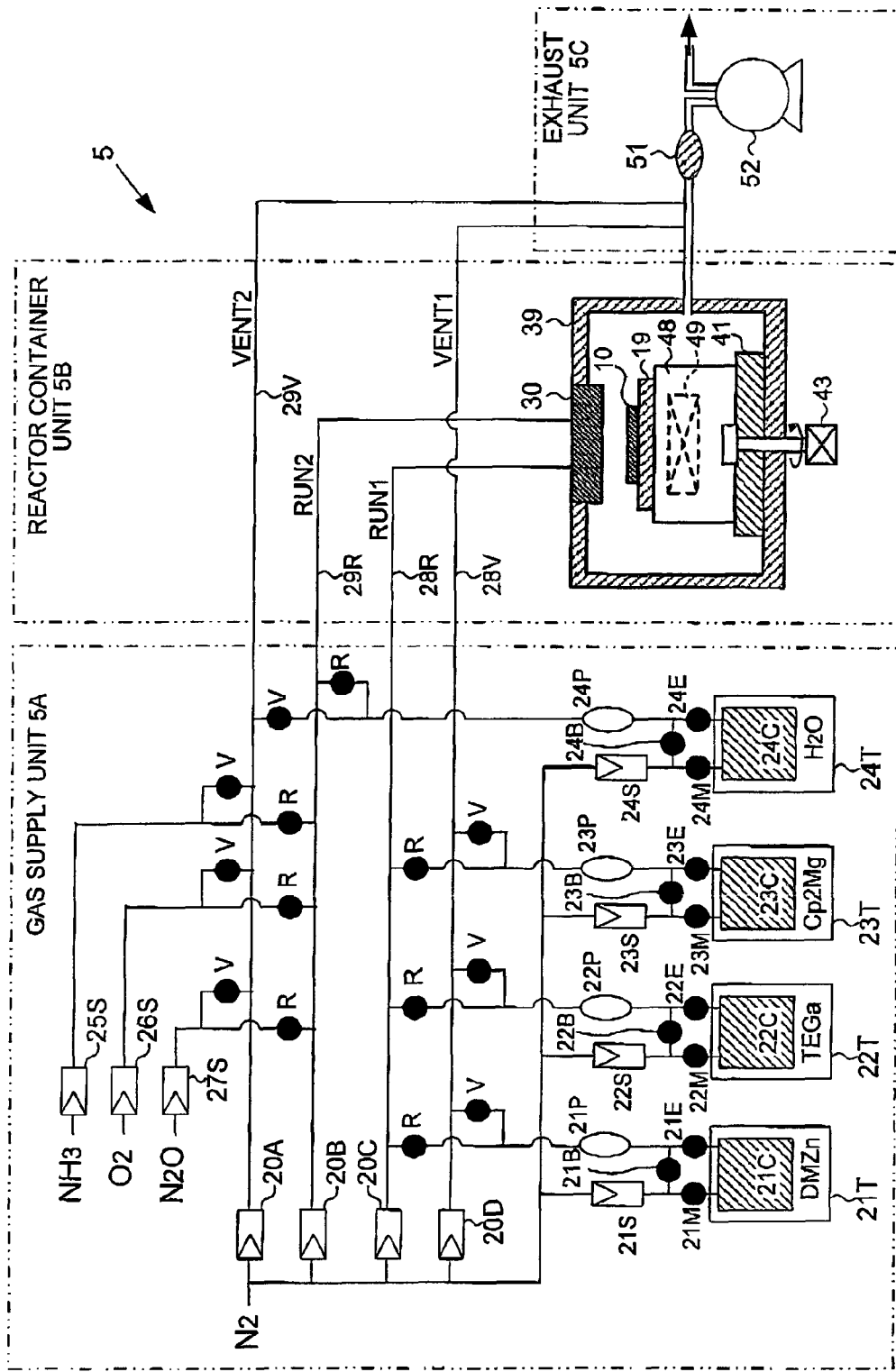
FIG. 1 is a view schematically showing a configuration of an MOCVD apparatus used in crystal growth.

FIG. 1 schematically shows a configuration of an MOCVD apparatus 5 used for crystal growth. Particulars about an apparatus configuration of the MOCVD apparatus 5 will be described hereinafter. Further, a crystal growth material will be described later in detail.

[Apparatus Configuration]

The MOCVD apparatus 5 includes a gas supply unit 5A, a reactor container unit 5B and an exhaust unit 5C. The gas supply unit 5A includes a portion that vaporizes a metalorganic (organometallic) compound material to be supplied, a portion that supplies a gaseous-material gas, and a transport unit including a function of transporting the gases.

The metalorganic compound material that is either a liquid or a solid substance at a room temperature is vaporized to be supplied. In the embodiment, DMZn (dimethyl zinc) is used as a zinc (Zn) source, a Cp2Mg (bis-cyclopentadienyl magnesium) is used as a magnesium (Mg) source, and TEGa (triethylgallium) is used as a gallium (Ga) source, respectively.

Supply of DMZn will be first described. As shown in FIG. 1, a flow rate adjustment device (i.e., a mass flow controller) 21S adjusts a nitrogen gas to have a predetermined flow rate to be supplied to a DMZn storing container 21C through a gas supply valve 21M, whereby DMZn vapor is saturated in the nitrogen gas. Further, the DMZn saturated nitrogen gas is supplied, through an outlet valve 21E and a pressure adjustment device 21P, to a first vent pipe (which will be referred to as a first VENT line (VENT1) hereinafter) 28V in a growth standby mode, and to a first run pipe (which will be referred to as a first RUN line (RUN1) hereinafter) 28R in a growth mode. It is to be noted that the pressure adjustment device 21P adjusts a pressure In the storing container constant. Additionally, the DMZn storing container is maintained at a fixed temperature by a thermostatic bath 21T.

Further, the other metalorganic compound materials Cp2Mg and TEGa are likewise processed. That is, the nitrogen gas with a predetermined flow rate having passed through each of flow rate adjustment devices 22S and 23S is supplied to each of storing containers 22C (Cp2Mg) and 23C (TEGa) that store these materials, and each of these gases is supplied to the first VENT line (VENT1) 28V through an outlet valve 22E or 23E and a pressure adjustment device 22P or 23P in the growth standby mode or supplied to the first RUN line (RUN1) 28R through the same in the growth mode.

Further, with regard to $H_2O$ (water vapor) which is a liquid material as an oxygen source, the nitrogen gas with a predetermined flow rate having passed through a flow rate adjustment device 24S is supplied to a storing container 24C, and the gas is supplied to a second vent pipe (which will be referred to as a second VENT line (VENT2) hereinafter) 29V through an outlet valve 24E and a pressure adjustment device 24P in the growth standby mode or supplied to a second run pipe (which will be referred to as a second RUN line (RUN2) hereinafter) 29R through the same in the growth mode.

As a p-type impurity source, an $NH_3$ (ammonia) gas that is a gaseous material is used. The $NH_3$ gas with a predetermined flow rate is supplied by a flow rate adjustment device 25S. This gas is supplied to the second VENT line (VENT2) 29V in the standby mode, and it is supplied to the second RUN line (RUN2) 29R in the growth mode. It is to be noted that this gas may be diluted with an inert gas such as nitrogen or Ar (argon).

The vapor of the liquid or solid material and the gaseous-material (which will be referred to as material gases) are supplied to a shower head 30 in the reactor container unit 5B through the first RUN line (RUN1) 28R and the second RUN line (RUN2) 29R. It is to be noted that flow rate adjustment devices 20C and 20B are provided to the first RUN line (RUN1) 28R and the second RUN line (RUN2) 29R, respectively, and the material gases are transported to the shower head 30 disposed to an upper portion of a reactor (or a chamber) 39 by a carrier gas (the nitrogen gas).

It is to be noted that the shower head 30 has an ejection surface facing a main surface (i.e., a growth surface) of a substrate 10 and many (e.g., several tens to hundred) ejection holes for the material gas are formed in the ejection surface in column and row directions. Furthermore, an effective ejection diameter of the ejection surface is 475 mm.

The ejection holes include first ejection holes from which the metalorganic compound material gas (a group-II gas) supplied from the first RUN line (RUN1) 28R is ejected and second ejection holes from which $H_2O$ (water vapor) (a group-VI gas) supplied from the second RUN line (RUN2) 28R is ejected. Further, the gas from the first RUN line 28R and the gas from the second RUN line 29R are ejected from the first ejection holes and the second ejection holes without being mixed with each other. The number of the first ejection holes is substantially equal to that of the second ejection holes, and these holes are provided at intervals of several mm and alternately arranged in respective columns and respective rows so that the ejected metalorganic compound material gas and $H_2O$ can be uniformly mixed.

The shower head 30 that sprays or ejects the material gases toward the substrate 10, the substrate 10, a susceptor 19 that holds the substrate 10, and a heater 49 that heats the susceptor 19 are disposed in the reactor 39. Furthermore, the heater 49 is configured to heat the substrate from a room temperature to approximately 1100° C.

It is to be noted that a substrate temperature in the embodiments means a surface temperature of the susceptor 19 on which the substrate is mounted. Specifically, in case of the MOCVD method, heat transfer from the susceptor 19 to the substrate 10 is effected by direct contact and a gas that is present between the susceptor 19 and the substrate 10. In a growth pressure range of 1 kPa to 120 kPa (Pa: pascal) used in the embodiments, a surface temperature of the substrate 10 is approximately 0° C. to 10° C. lower than a surface temperature of the susceptor 19.

Moreover, a rotation mechanism which rotates the susceptor 19 is provided in the reactor 39. In more detail, the susceptor 19 is supported by a susceptor support cylinder 48, and the susceptor support cylinder 48 is rotatably supported on a stage 41. Additionally, when a rotary motor 43 rotates the susceptor support cylinder 48, the susceptor 19 (i.e., the substrate 10) is rotated it is to be noted that the heater 49 is disposed in the susceptor support cylinder 48.

The exhaust unit 5C is constituted of an in-container pressure adjustment device 51 and an exhaust pump 52 and configured to adjust a pressure in the reactor 39 from approximately 0.01 kPa to 120 kPa by using the in-container pressure adjustment device 51.

[Material for Crystal Growth]

In the embodiments, as the metalorganic compound material, a material that does not contain oxygen in constituent molecules is used. The metalorganic material that does not contain oxygen has high reactivity with water vapor (an oxygen material or an oxygen source) and enables growth of a ZnO-based crystal even in a region having a low growth pressure or having a low flow ratio ($F_{H2O}/F_{MO}$ ratio) or a low VI/II ratio of the water vapor and the metalorganic material (MO).

Although DMZn, Cp2Mg and TEGa (a high-purity product for a semiconductor material) are used in the embodiments and the comparative example, DEZn (diethyl zinc), MeCp2Mg (bis-methylpentadienyl magnesium), EtCp2Mg (bis-ethylpentadienyl magnesium) and the like can be utilized. Further, as a group-III material, TMGa (trimethylgallium), TMA1 (trimethylaluminum), TEA1 (triethylaluminum), TIBA (triisobutylaluminum) and the like can be used.

As an oxygen material (which will be also referred to as an oxygen source hereinafter), a polar oxygen material (a polar oxygen source) is suitable. In particular, $H_2O$ (water vapor) has an excellent adsorption capability with respect to an oxide crystal surface since a side where a hydrogen atom is coupled in a molecule and a lone-pair electron side are largely polarized to $\delta^+$ and $\delta^-$.

Furthermore, an $H_2O$ molecule has hydrogen atomic bonds and lone-pair electrons forming a tetrahedral structure, and it is an excellent oxygen source that preferentially performs oriented adsorption to an oxygen site in oxide crystal growth of a $sp^3$ type hybrid orbital zincblende structure (Zincblende/Cubic) or a wurtzite structure (Wurtzeite/Hexagonal). As other oxygen sources, likewise, lower alcohols in which a dipole moment is large and an O atom takes the $sp^3$ type hybrid orbital may be used. That is, specifically, besides $H_2O$ (water vapor), lower alcohols, especially lower alcohols of which carbon number is 1 to 5 such as methanol, ethanol, propanol, butanol or pentanol can be utilized as oxygen sources.

As a p-type impurity material, a compound that can be readily substituted to an O (oxygen) site of a zincblende structure or a wurtzite structure in a crystal growth process is suitable. In particular, $NH_3$ is suitable since it has the same effect as $H_2O$. Specifically, as the p-type impurity material, hydrazines such as $NH_3$ (ammonia), $(CH_3)_2NNH_2$ (dimethylhydrazine) or $(CH_3)NHNH_2$ (monomethylhydrazine), an alkyl phosphorous compound such as $R_1PH_2$, $R_2PH$ or $R_3P$, or an alkyl arsenic compound such as $AsH_3$, $R_1AsH_2$, $R_2AsH$ or $R_3As$ can be utilized.

As a carrier gas (or atmosphere gas), an inert gas that does not react with each of the above-described crystal growth materials is suitable. Moreover, a gas that does not obstruct adsorption of the crystal growth material such as $H_2O$ (water vapor) or $NH_3$ with the substrate surface is preferable. Specifically, as the carrier gas and an ambient or atmosphere gas, an inert gas such as He (helium), Ne (neon), Ar (argon), Kr (krypton), Xe (xenon) or $N_2$ (nitrogen) can be utilized. In the following embodiments of the invention and the comparative examples, an $N_2$ (nitrogen) gas of the JIS (Japanese Industrial Standard) grade-1 having a residual $O_2$ concentration that is less than 5 ppm was used.

The ZnO (zinc oxide) substrate is a crystal having a wurtzite structure, and there are c-plane or a {0001} plane, an a-plane or a {11-20} plane, an m-plane or a {10-10} plane, and an r-plane or a {10-12} plane as typical substrate cut planes. Moreover, as the c-planes, there are a Zn-polar plane (i.e., +c plane) and an O-polar plane (i.e., −c plane).

In each of the embodiments of the invention and comparative examples described below, a ZnO single crystal substrate sliced out from an ingot manufactured by a hydrothermal method was used. It is to be noted that a substrate having a residual Li concentration reduced by a treatment such as a high-temperature heat treatment (equal or more than 1000° C.) was used.

Additionally, as the ZnO single crystal substrate 10, a substrate (which will be also referred to as a c-plane ZnO single crystal substrate hereinafter) whose substrate main plane (i.e., a crystal growth plane) is a Zn polar plane (i.e., +c plane) is preferable. In each of the following embodiments and comparative examples, a substrate whose crystal growth plane is a Zn polar plane was used. Further, a substrate whose substrate main plane (a crystal growth plane) is inclined to one of an a-axis and an m-axis is preferable. In each of the following embodiments and comparative examples, a so-called 0.5°-off substrate whose (0001) plane is inclined to a [10-10] direction at 0.5° (or a 0.5°-off substrate whose c-plane is inclined to the m-axis direction at 0.5° was utilized.

[Method for Growing ZnO Single Crystal]

A ZnO crystal was grown on a ZnO single crystal substrate by using the MOCVD apparatus. It is to be noted that, in the embodiments, boiling cleaning (including organic cleaning) using ultrapure water was performed before growth to remove lithium (Li), potassium (K) and sodium (Na) present on a substrate surface. A growth method according to the embodiment will now be described hereinafter in detail with reference to a crystal growth sequence shown in FIG. 2.

First, a ZnO single crystal substrate (which will be referred to as a ZnO substrate or simply a substrate hereinafter) 10 was set on the susceptor 19 in the reactor 39, air was exhausted to form a vacuum, and then a pressure in the reactor was adjusted to 10 kPa (at a time T=T11). Further, the ZnO substrate 10 was rotated at 10 rpm by the rotation mechanism.

Then, a nitrogen ($N_2$) gas was supplied to the shower head 30 from each of the first RUN line (RUN1) 28R and the second RUN line (RUN2) 29R with a flow rate of 2000 cc/min (4000 cc/min in total) to be sprayed or ejected onto the ZnO substrate 10.

It is to be noted that, the gas flow rate supplied to the shower head 30 from the first RUN line (RUN1) 28R and the second RUN line (RUN2) 29R was maintained constant. That is, when supplying a metalorganic material gas and a gaseous material in, e.g., a growth standby mode and a growth mode, a flow rate of each of the flow rate adjustment devices 20C and 20B provided to the first RUN line (RUN1) 28R and the second RUN line (RUN2) 29R was increased or decreased by an amount corresponding to the flow rate of each of metalorganic material gas and the gaseous material, thereby maintaining the gas flow rate supplied to the shower head 30 constant.

Then, a flow rate of $H_2O$ (water vapor) was adjusted to 640 μmol/min to perform spray onto the ZnO substrate 10 from the second RUN line 29R simultaneously with start of increasing a substrate temperature from a room temperature (RT) to a substrate heat treatment temperature (800° C.) (T=T12). After the substrate temperature reached 800° C., this state was maintained for 10 minutes and then a heat treatment of the substrate was performed (T=T13 to T14).

Figure 2:
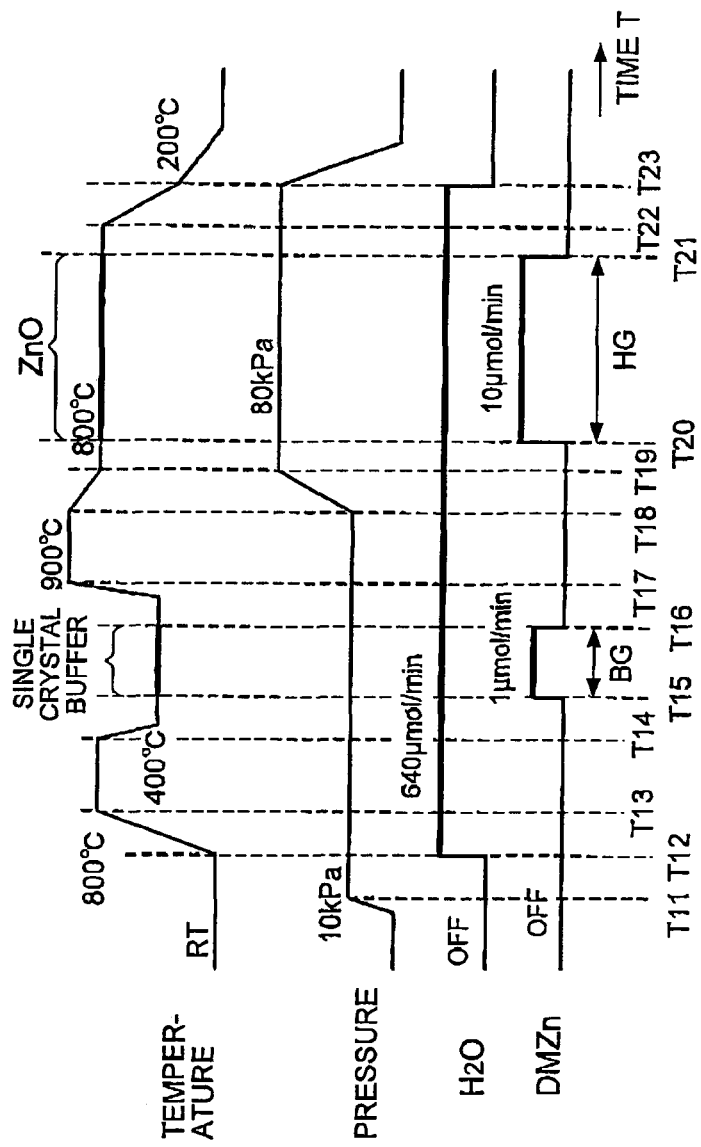
FIG. 2 is a view showing a crystal growth sequence according to a first embodiment of the invention.
Figure 3:
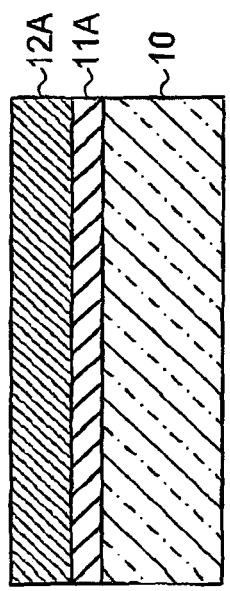
FIG. 3 is a cross-sectional view showing a configuration of a growth layer according to the first embodiment of the invention in which a buffer layer and a ZnO single crystal layer are grown on a substrate.

The substrate temperature was reduced from 800° C., and the operation waited for one minute after reaching a predetermined low growth-temperature (Tb=400° C. in the embodiment). After the waiting, a flow rate of DMZn was adjusted to 1 μmol/min, and spray was effected onto the ZnO substrate 10 from the shower head 30 to start growth of a low-temperature buffer layer 11A (which will be also referred to as a first growth layer hereinafter) (T=T15). As shown in FIG. 3, a low-temperature ZnO single crystal layer (LT-ZnO) having a layer thickness of approximately 25 nm was grown as the buffer layer 11A through 15-minute growth (FIG. 2, BG) (T=T15 to T16). It is to be noted that a growth rate of the low-temperature buffer layer 11A was 1.67 nm/min (=100 nm/hr).

Then, the temperature of the substrate was increased to 900° C. to restore crystallinity and flatness of the buffer layer 11A, the operation waited for 10 minutes, and a heat treatment (annealing) of the buffer layer 11A was carried out (T=T17 to T18).

The temperature of the substrate was increased to a predetermined high growth-temperature Tg (Tg=800° C. in the embodiment) simultaneously with an increase of ambient pressure from 10 kPa to 80 kPa (T=T18 to T19). The operation waited for one minute after the pressure reached 80 kPa and the substrate temperature reached 800° C., the flow rate of DMZn was adjusted to 10 μmol/min to be sprayed onto the ZnO substrate 10 from the shower head 30 to start crystal growth (T=T20). As shown in FIG. 3, a ZnO single crystal layer 12A (which will be also referred to as a second growth layer hereinafter) having a thickness of approximately 1 μm (a growth rate is 1 μm/hr) was formed on the buffer layer 11A (or the first growth layer) based on 60-minute growth (FIG. 2, HG, T=T20 to T21).

It is to be noted that the predetermined low growth-temperature (i.e., a growth temperature of the buffer layer) used herein means a temperature (a low temperature) at which the growth of a quasi-thermostable state (or a quasi-thermal equilibrium state) is performed, and the predetermined high growth-temperature (a temperature at which a ZnO crystal is grown on the buffer layer) means a temperature (a high temperature) at which the growth of a thermostable state (or a thermal equilibrium state) is performed. It is to be noted that the definition of "the thermostable state (or the thermal equilibrium state)" and "the quasi-thermostable state (or the quasi-thermal equilibrium state)" will be described later.

After the termination of the growth, the pressure was maintained at 80 kPa, and cooling was performed in this state while flowing the water vapor ($H_2O$) until the substrate temperature drops to 200° C. (T=T22 to T23). Then, the pressure was reduced to a pump vacuum (i.e., approximately $10^{-1}$ Pa), and the supply of $H_2O$ was stopped at the same time. The operation waited until the substrate temperature reaches the room temperature, and then the growth sequence was terminated. It is to be noted that the reduction in pressure and the stop of $H_2O$ supply during cooling may be carried out after the substrate reaches the room temperature (RT).

As described above, in the first embodiment of the invention, (1) the ZnO single crystal substrate (without etching) was used;
(2) the substrate heat treatment ($T_{anl}$=800° C.) was carried out;
(3) the water vapor ($H_2O$) and the metalorganic compound containing no oxygen were used;
(4) the buffer layer (the low-temperature growth buffer layer: LT-Baffer) was formed based on the low-temperature growth ($T_{buf}$=400° C.), and the crystallinity of the buffer layer was restored by the annealing ($T_{cry}$=900° C.); and
(5) the ZnO crystal (the high-temperature growth ZnO layer: HT-ZnO) was grown on the buffer layer by the high-temperature growth (Tg=800° C.).

Second Embodiment

In this embodiment, a ZnO single crystal substrate was etched to remove deposits. A growth method including a growth material, a growth sequence (FIG. 2) and growth conditions is the same as that in the first embodiment except that the substrate was etched.

It is to be noted that a mixed solution obtained by mixing a solution containing 0.2 mol/L of EDTA·2Na (ethylene-diamine-tetra-acetic acid disodium salt) with a solution containing 99% of EDA (ethylene diamine) with a ratio of 20:1 was used as an etchant. An etching rate of this etchant (EDTA·2Na:EDA=20:1) is 0.7 μm/h. It is to be noted that the etchant is disclosed in Japanese Patent Application Laid-open No. 2007-1787. Further, a mixing ratio of the etchant is approximately 5:1 to 30:1, and etching can be excellently performed with this ratio.

The substrate was immersed in the etchant at a room temperature for 10 min (minutes) to etch a surface layer thereof. Then, the etchant was removed by water washing, and dewatering was performed by organic solvent cleaning (acetone or alcohol). At last, the organic solvent was heated, and drying was carried out in a vapor atmosphere. It is to be noted that etching conditions, e.g., a temperature, a time and the like vary depending on a substrate surface treatment and a storage state of the substrate.

Specifically, in the second embodiment, water vapor ($H_2O$) and the metalorganic compound containing no oxygen were used. A buffer layer 11B (a first growth layer) was grown at low growth-temperature (LT) on a ZnO single crystal substrate 10 which was subjected to substrate etching and a heat treatment ($T_{anl}$=800° C.), and then a ZnO crystal 12B (a second growth layer) was grown on the buffer layer 11B at a high growth-temperature (HT).

Figure 4:
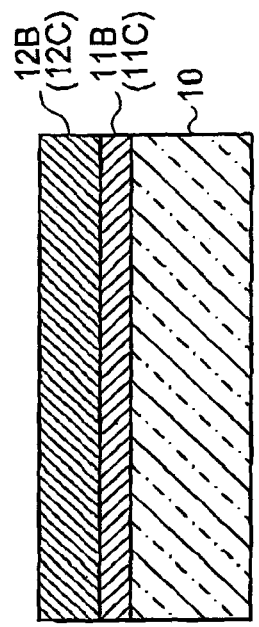
FIG. 4 is a cross-sectional view showing a configuration of a growth layer according to a second embodiment of the invention in which a buffer layer and a ZnO single crystal layer are grown on a substrate.

In more detail, as shown in a cross-sectional view of FIG. 4, the buffer layer 11B (a layer thickness is 25 nm) was formed based on low-temperature growth ($T_{buf}$=400° C.) (a growth rate is 1.67 nm/min (=100 nm/hr)), and crystallinity of the buffer layer 11B was restored by annealing ($T_{cry}$=900° C.). Furthermore, the ZnO crystal 12B (a layer thickness is 1 μm, a growth rate is 1 μm/hr) was grown on the buffer layer 11B based on the high-temperature growth (Tg=800° C.) It is to be noted that the growth method including growth conditions, heat treatment conditions and the like is the same as that in the first embodiment.

Third Embodiment

This embodiment is the same as the second embodiment except that a growth temperature of a buffer layer was set to 300° C. ($T_{buf}$=300° C.). More specifically, water vapor ($H_2O$) and the metalorganic compound containing no oxygen were used to grow a buffer layer 11C and a ZnO crystal 12C on a ZnO single crystal substrate 10 in which the substrate 10 was subjected to etching and a heat treatment ($T_{anl}$=800° C.). It is to be noted that the substrate having these growth layers formed thereon has the same layer structure as that in the second embodiment, and reference numerals in parentheses represent configurations of the buffer layer 11C and the ZnO crystal 12C of the third embodiment in a cross-sectional view (FIG. 4) showing the configuration of the second embodiment.

In more detail, the buffer layer 11C (a layer thickness is 25 nm) was formed based on low-temperature growth ($T_{buf}$=300° C.), and crystallinity of the buffer layer 11C was restored by annealing ($T_{cry}$=900° C.). Furthermore, the ZnO crystal 12C (a second growth layer) having a layer thickness of 1 μm was grown on the buffer layer 11C (the first growth layer) based on the high-temperature growth (Tg=800° C.). It is to be noted that the growth method including growth conditions, heat treatment conditions and the like is the same as that in the second embodiment as described above.

ZnO single crystal layers each having excellent flatness and crystal orientation were obtained by the first to third embodiments.

Comparative Example

To evaluate the ZnO-based single crystal layer grown according to each of the first to third embodiments, crystal growth was carried out based on the following growth method and growth conditions as a comparative example.

Figure 5:
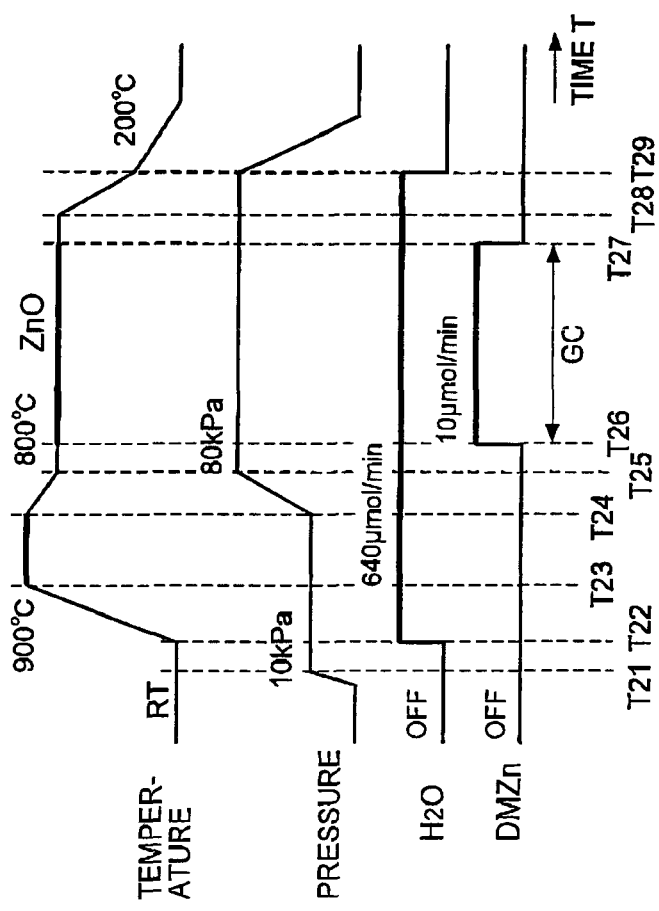
FIG. 5 is a view showing a crystal growth sequence used in a comparative example.

The MOCVD apparatus 5 was utilized to grow a ZnO single crystal on a ZnO single crystal substrate. It is to be noted that, in this comparative example, a substrate surface was not etched like the first embodiment. Moreover, FIG. 5 shows a crystal growth sequence in the comparative example. As shown in FIG. 5, in the comparative example, a ZnO single crystal was directly grown on a ZnO single crystal substrate 10 at a high temperature without forming a low-temperature buffer layer.

First, a ZnO single crystal substrate 10 was set on the susceptor 19 in the reactor 39, air was exhausted to form a vacuum, and then a pressure in the reactor was adjusted to 10 kPa (a time T=T21). Further, the ZnO substrate 10 was rotated at 10 rpm by the rotation mechanism.

Subsequently, a nitrogen ($N_2$) gas was supplied to the shower head 30 from each of the first RUN line (RUN1) 28R and the second RUN line (RUN2) 29R with a flow rate of 2000 cc/min (4000 cc/min in total) to be sprayed onto the ZnO substrate 10.

Then, $H_2O$ (water vapor) of the second RUN line 29R was adjusted to have a flow rate of 640 μmol/min and sprayed onto the ZnO substrate 10 simultaneously with start of increasing a substrate temperature from a room temperature (RT) to a substrate heat treatment temperature (900° C.) (T=T22). After the substrate temperature reached 900° C., this state was maintained for 10 minutes and then a heat treatment for the substrate was performed (T=T23 to T24).

Figure 6:
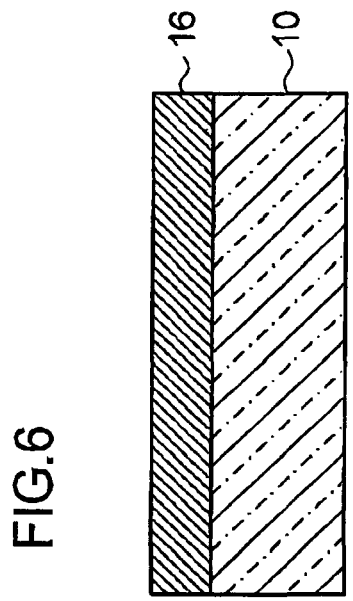
FIG. 6 is a cross-sectional view showing a configuration of a growth layer used in the comparative example.

The temperature of the substrate was increased to a predetermined high growth-temperature Tg (Tg=800° C. in this comparative example) simultaneously with an increase of pressure from 10 kPa to 80 kPa (T=T24 to T25). The operation waited for one minute after the pressure reached 80 kPa and the substrate temperature reached 800° C., the flow rate of DMZn was adjusted to 10 μmol/min, and spray was effected onto the ZnO substrate 10 from the shower head 30 to start crystal growth (T=T26). As shown in FIG. 6, a ZnO single crystal layer 16 having a thickness of approximately 1 μm was formed based on 60-minute growth (FIG. 5, HG, T=T26 to T27).

A series of processes from the cooling after the end of growth, a reduction in pressure to produce a vacuum, stop of water vapor supply and the like are the same as those in the foregoing embodiments.

[Detailed Evaluation Results and Physical Properties of Crystal Growth Layer]

Evaluation results, physical properties and the like of the crystal growth layers in the first to third embodiments and the comparative example will now be described hereinafter in detail with reference to the drawings. It is to be noted that FIG. 7 shows a list of growth conditions, evaluation results and physical properties of the respective crystal growth layers according to the embodiments and the comparative example. Further, as shown in FIG. 7, in the following description, the crystal growth layers according to the first to third embodiments also simply referred to as EMB1, EMB2 and EMB3 (each of which may used as a generic name of the growth layer including the buffer layer and the ZnO growth layer), and the crystal growth layer according to the comparative example is also simply referred to as CMP for brevity of description and better understanding. The crystal growth layers were evaluated and analyzed based on the following method.

A surface morphology was evaluated by using a differential polarizing microscope, an SEM (Scanning Electron Microscope) and an AFM (Atomic Force Microscope). Crystal orientation and flatness were evaluated using RHEED (reflection high-energy electron diffraction) Furthermore, crystal orientation and a defect and dislocation density were evaluated by using an X-ray diffractometer (XRD). An impurity concentration in the crystal was evaluated based on secondary ion mass spectrometry (SIMS).

It is to be noted that, in the XRD analysis, since the ZnO-based crystal layer was grown on the c-plane ZnO single crystal substrate 10 in each of the embodiments and the comparative example, 2θ measurement and w (rocking curve) measurement of the XRD were performed, a c-axis length was evaluated by using (002)2θ, and crystal orientation (or a degree of tilting or twisting) was evaluated by using a full width at half maximum (FWHM) of (002)ω or (100)ω. However, in case of a thin film of approximately 1 μm or below, a (002)ω measurement value cannot be accurately evaluated since an X-ray diffraction intensity of the substrate is large and an X-ray diffraction intensity of the growth layer is small. On the other hand, with regard to (100)ω measurement, a high-sensitivity evaluation of the crystal orientation can be performed with incidence/diffraction angle of 89° with reference to the c axis even if the crystal film is thin (approximately 30 nm). Therefore, in the XRD evaluation of the ZnO-based crystal layer, an FWHM value of (100)ω was determined as an index or measure.

It is to be noted that the crystallinity or crystal quality of the ZnO single crystal substrate manufactured by the hydrothermal method used in the present invention was excellent, and full widths at half maximum of (002)ω and (100)ω of the substrate having the etched surface were approximately 27 arcsec and 29 arcsec, respectively. Empirically, if each of the full widths at half maximum is 35 arcsec or less than 35 arcsec, the ZnO single crystal substrate can be preferably used as the substrate for a semiconductor light emitting element according to the present invention.

1. Growth Layer According to First Embodiment: EMB1

The first embodiment is an example in which the low-temperature buffer layer 11A (the first growth layer) was formed and the ZnO single-crystal layer 12A (the second growth layer) was grown on the buffer layer. More specifically, the buffer layer was formed based on the low-temperature growth, and crystallinity of the buffer layer was restored by the annealing (or heat treatment). Additionally, the ZnO single crystal layer was grown on the buffer layer based on the high-temperature growth (EMB1, see FIG. 3).

(Flatness and Crystal Orientation)

Figure 9:
FIG. 9 shows an AFM image of the surface of the ZnO growth layer according to the first embodiment of the invention.
Figure 8:
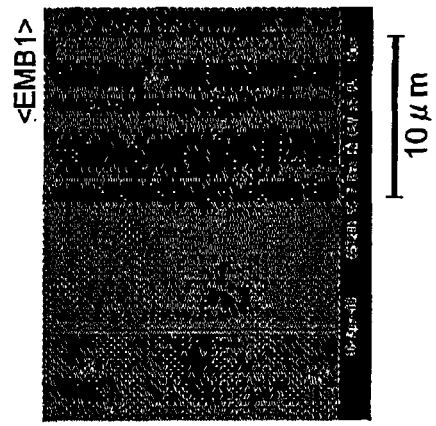
FIG. 8 shows an SEM image of a surface of a ZnO growth layer (EMB1) according to the first embodiment of the invention.

A surface state of the ZnO single crystal layer 12A (the second growth layer) according to the first embodiment was evaluated in detail using the differential polarizing microscope, the SEM and the AFM. FIG. 8 shows an SEM image of the growth layer surface, and it was confirmed that the surface has a flat and excellent surface morphology. It is to be noted that the SEM imaging was carried out in such a manner that a pit can be provided in a viewing field to show that the SEM image is obtained at an in-focus point. This can be likewise applied to the following embodiments. Further, FIG. 9 shows an AFM image of the growth layer surface, and flatness was excellent since surface RMS roughness (or Rq, root mean square roughness)=0.84 nm was obtained in 1 $\mu m^2$ in an observation area of the AFM. It was confirmed from these observation results that high flatness was provided from a wide region to a small region (macroscopically and microscopically).

Figure 11:
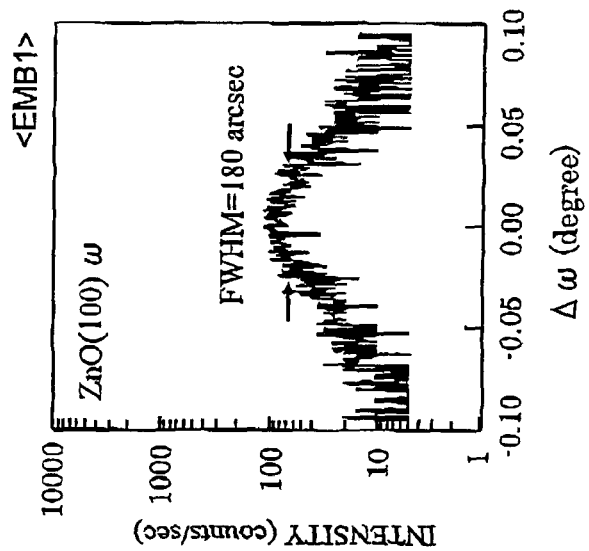
FIG. 11 is a view showing an XRD (100)ω rocking curve according to the first embodiment of the invention.
Figure 10:
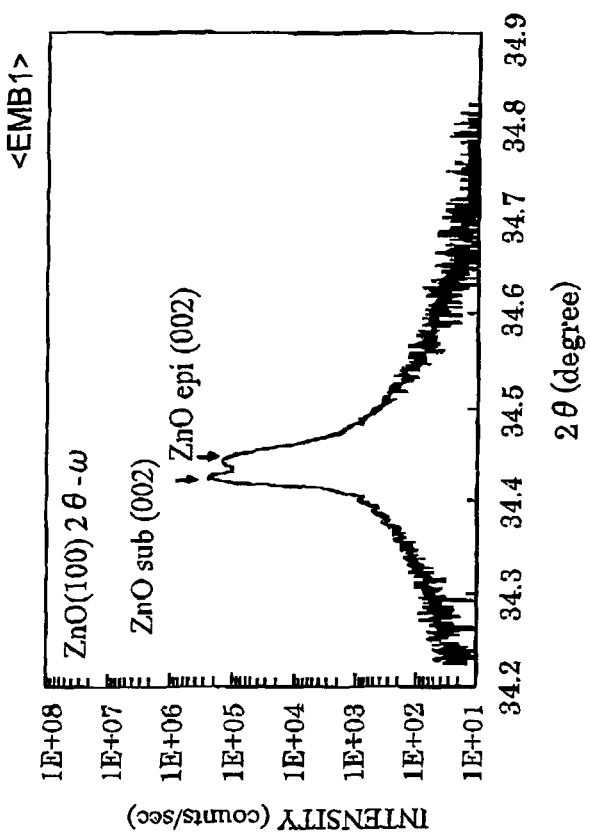
FIG. 10 is a view showing an XRD (002)2θ measurement result of the ZnO growth layer according to the first embodiment of the invention.

In regard to crystal orientation with respect to the substrate, as shown in FIG. 10, it was confirmed in the (002)2θ measurement of the XRD that a peak of the ZnO single crystal layer 12A (ZnO epi (002)) is shifted 0.0168° to a high-angle side with respect to a substrate peak (ZnO sub (002)). Furthermore, as shown in FIG. 11, it was recognized that a full width at half maximum (FWHM) of the (100)ω rocking curve is as wide as 180 arcsec and the ZnO layer has crystal orientation inferior to that of the (later-described) comparative example.

In these results, a noteworthy point is that the ZnO single crystal layer 12A (the second growth layer) according to this embodiment has a lattice constant deviation and it has excellent surface flatness even though its crystal orientation is poor. That is, it was recognized that the single-crystal buffer layer 11A according to this embodiment has an excellent function or capability for forming thereon a ZnO-based crystal layer having excellent flatness on the buffer layer.

2. Growth Layers According to Second and Third Embodiments: EMB2, EMB3

In the second embodiment, the ZnO single crystal substrate was etched, and then the buffer layer (the first growth layer) and the ZnO single crystal layer (the second growth layer) were grown by the same method as that in the first embodiment.

Figure 12:
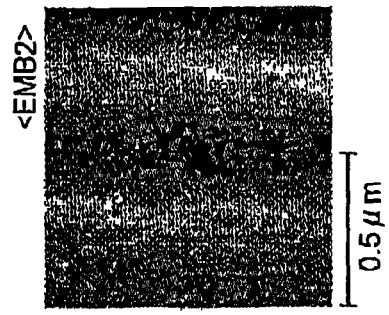
FIG. 12 shows an SEM image of a surface of a ZnO growth layer (EMB2) according to the second embodiment of the invention.
Figure 13:
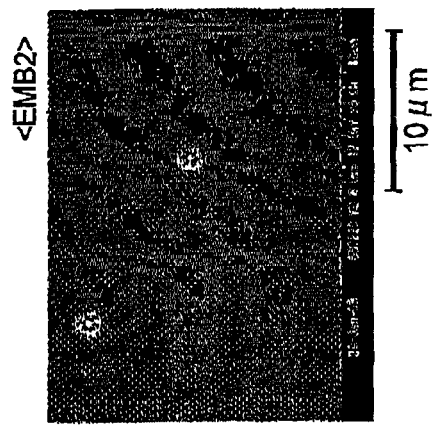
FIG. 13 shows an AFM image of the surface of the ZnO growth layer according to the second embodiment of the invention.

A surface state of the ZnO single crystal layer 12A (EMB2) according to the second embodiment was observed in detail by using the differential polarizing microscope, the SEM and the AFM. FIG. 12 shows an SEM image of the growth layer surface, and it was confirmed that the surface has a flat surface morphology of a mirror plane. It is to be noted that the SEM imaging was carried out in such a manner that a pit can be provided in a viewing field to show that the SEM image is obtained at an in-focus point as described above. Further, FIG. 13 shows an AFM image of the growth layer surface, and flatness was excellent since surface roughness RMS (or Rq, root mean square roughness)=0.29 nm was obtained in 1 $\mu m^2$ in an AFM observation area. It was confirmed from these observation results that high flatness was provided from a wide region to a small region (macroscopically and microscopically).

Figure 14:
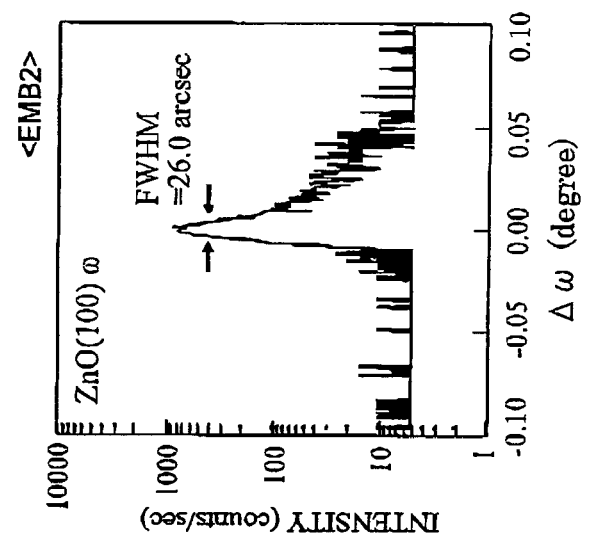
FIG. 14 is a view showing an XRD (002)2θ measurement result of the ZnO growth layer according to the second embodiment of the invention.
Figure 15:
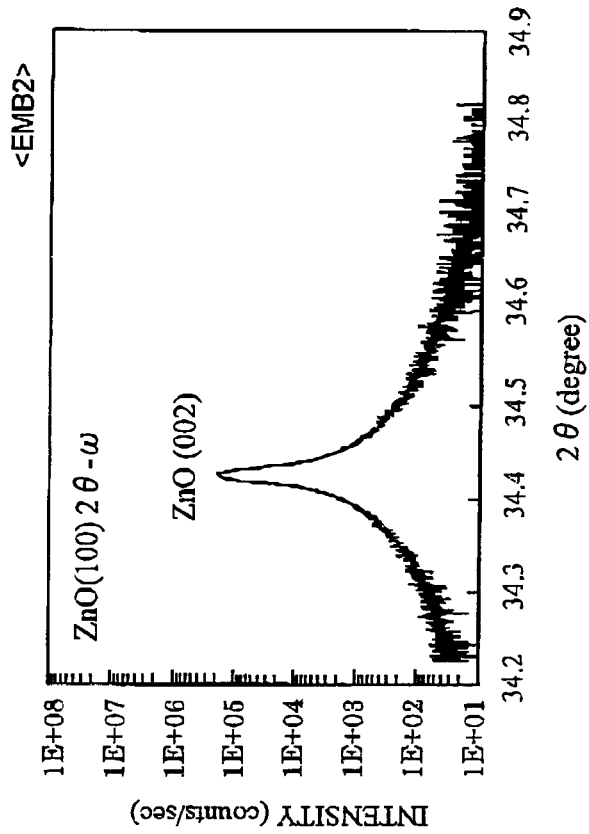
FIG. 15 is a view showing an XRD (100)ω rocking curve of the ZnO growth layer according to the second embodiment of the invention.

Moreover, as shown in FIG. 14, in (002)2θ measurement of the XRD, a substrate peak (ZnO sub (002)) coincided with a peak of the ZnO single crystal layer 12B (ZnO epi (002)). Additionally, as shown in FIG. 15, it was confirmed that a full width at half maximum (FWHM) of a (100)ω rocking curve is as narrow as 26 arcsec and the ZnO single crystal layer has excellent crystal orientation and a low defect and dislocation (spiral dislocation, edge dislocation) density.

Further, the ZnO single crystal layer 12C (EMB3) (the second growth layer) according to the third embodiment was also evaluated in the same manner (FIG. 7) As described above, the growth temperature (300° C.) of the buffer layer in the third embodiment is different from that (400° C.) in the second embodiment. It was confirmed from an evaluation result that the ZnO single crystal layer 12C (EMB3) is a ZnO single crystal layer that has high flatness, excellent crystal orientation and a low defect and dislocation density like the second embodiment.

3. Growth Layer According to Comparative Example: CMP

The growth layer according to the comparative example is a ZnO crystal layer 16 (CMP) directly grown on the ZnO substrate at a high temperature (800° C.) without forming a low-temperature buffer layer. It was recognized in the SEM observation that the grown ZnO crystal layer 16 has a fold surface or fold-like irregularities.

Figure 18:
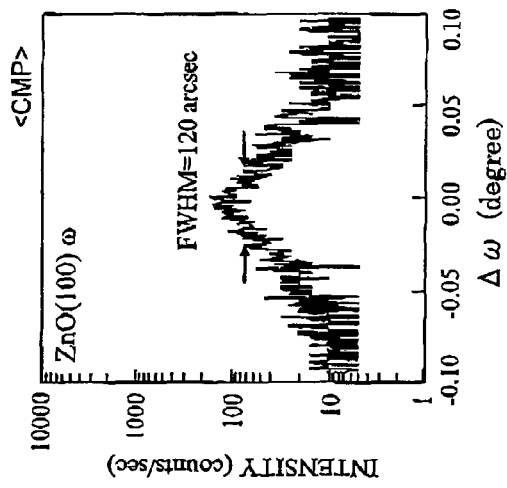
FIG. 18 is a view showing an XRD (100)ω rocking curve of the ZnO growth layer according to the comparative example.
Figure 16:
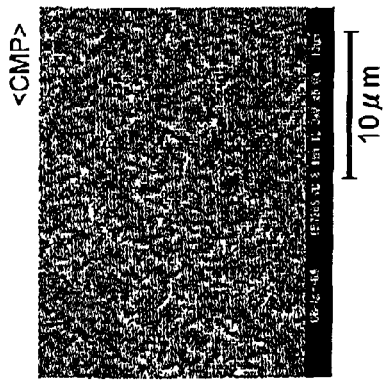
FIG. 16 shows an SEM image of a surface of a ZnO growth layer according to the comparative example.
Figure 17:
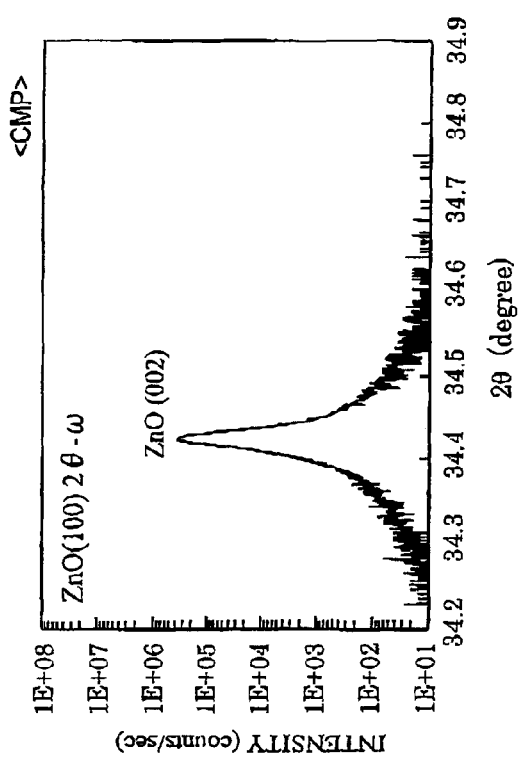
FIG. 17 is a view showing an XRD (002)2θ measurement result of the ZnO growth layer according to the comparative example.

FIG. 16 is an SEM image of the grow layer surface showing folded irregularities. FIG. 17 and FIG. 18 show results of (002)2ω measurement of the XRD and (100)ω rocking curve measurement. As shown in FIG. 18, an FWHM of the (100)ω rocking curve is as wide as 120 arcsec, and it was confirmed that the ZnO crystal layer 16 (CMP) is a ZnO crystal layer having poor crystal orientation and a low defect/dislocation density.

[Factors of High-Quality Single Crystal Layer Growth]

As described in conjunction with the embodiments and the comparative example, the ZnO crystal layer having excellent flatness was grown on the buffer layer in the first embodiment, and the ZnO crystal layer having excellent flatness and crystal orientation and a low defect/dislocation density was grown on a buffer layer in the second and third embodiments. Factors that enable growth of such a high-quality ZnO single crystal layer and growth conditions were examined in detail.

A first feature or aspect of the growth method according to the present invention lies in that a ZnO single crystal of a quasi-thermostable state (which will be described later in detail) can be formed as a single-crystal buffer layer. In more detail, an amorphous or polycrystalline crystal is usually obtained when a ZnO crystal is grown at a low temperature, approximately 300° C. to 500° C.) However, in the present embodiments, a ZnO single crystal of the quasi-thermostable state having an excellent function or capability as the buffer layer can be grown, when $H_2O$ (water vapor) and a metalorganic material containing no oxygen are used to perform growth under low pressure (or reduced pressure) and low growth rate conditions. Furthermore, the buffer layer having crystallinity restored (i.e., transition to a thermostable state) by annealing has excellent characteristics or physical properties as an underlying crystal or base crystal that is required to grow a ZnO-based single crystal.

Moreover, a second feature of the growth method according to the present invention lies in that a ZnO single crystal having excellent flatness and crystal orientation, a low defect and dislocation density and high integrity can be formed on the buffer layer under high-temperature growth conditions.

The crystal in the "thermostable state" herein means a crystal whose chemical-bonding state is stable. More specifically, it can be defined as a crystal, which has been grown in the Frank-van der Merwe mode, a "single crystal" in light of crystal engineering, and a crystal in a "thermal equilibrium state" in light of thermodynamics.

For example, a chemical-bonding state of the ZnO crystal grown at a high temperature (e.g., 800° C.) according to the first to third embodiments is a thermo-stable state (or a ground state). Therefore, a crystal state does not readily vary due to a heat treatment.

On the other hand, a later-described crystal in a "quasi-thermostable state" means a crystal whose chemical-bonding state is unstable. In more detail, it can be defined as a crystal, which grows in the Stranski-Krastanow growth mode or a similar mode and is a "single crystal" in light of crystal engineering and a crystal in a "quasi-thermal equilibrium state" in light of thermodynamics. It is to be noted that the state of a thin-film single crystal layer, which is precisely a non-thermal equilibrium state but not the most stable state is defined as a quasi-thermal equilibrium state so as to be strictly distinguished from a polycrystal thin film state. For example, the ZnO buffer layer (LT-ZnO) grown at a low temperature (e.g., 400° C.) is in the quasi-thermal equilibrium state, and its chemical-bonding state is not yet changed to a thermochemically stable state (i.e., a thermostable state). Therefore, due to a heat treatment at a high temperature (e.g., 900° C.), its crystal state considerably changes to a step-and-terrace-like shape of which surface energy becomes minimum are provided. In other words, the crystal state changes to the thermostable state.

Additionally, it is to be noted that a crystal in a "non-thermostable state" can be defined as "amorphous" or a "polycrystal" in terms of crystal engineering or a crystal in the "non-thermal equilibrium state" in terms of thermodynamics. For example, a ZnO amorphous or polycrystal buffer layer grown at a low temperature (e.g., 400° C.) is in the "non-thermal equilibrium state". Therefore, a crystal bonding state and a surface state considerably change due to a heat treatment at a high temperature (e.g., 900° C.). However, since a start state is an amorphous or polycrystal state, the non-thermostable state crystal cannot be changed to a single crystal having high integrity and a step-and-terrace surface state. In other words, transition to the "thermostable state" is impossible.

(1) Function as Buffer Layer (First Growth Layer)

According to each of the first to third embodiments, the buffer layer having an excellent function was obtained by forming the quasi-thermostable-state ZnO single crystal and changing a state of the single crystal to the thermostable state by annealing.

There is known a so-called buffer layer technology that grows a ZnO crystal at a low temperature that is, e.g., less than 500° C., forming a flat and dense amorphous or particulate polycrsytal and performing a heat treatment at a high temperature to restore crystallinity as described above. However, even though the conventional buffer layer technology is utilized to grow a ZnO-based crystal on a buffer layer at a high temperature, growing thereon a ZnO-based single crystal having sufficient flatness and crystal orientation is difficult.

To grow a quasi-thermostable single crystal buffer layer, an environment where a crystallization material can sufficiently migrate on a substrate surface is given as a first step, and a crystal growth rate is lowered as a second step. In this embodiment, an environment that facilitates migration was provided by performing growth under a low pressure and lowering a density of a surface chemical species (e.g., $H_2O$, a metalorganic material, or intermediates thereof). The latter was realized by reducing a supply amount of the metalorganic material and decreasing the growth rate.

Additionally, if such growth conditions are adopted, crystal growth becomes difficult. However, this was solved by using $H_2O$ (water vapor) having a large dipole moment and an excellent adsorption capability to a ZnO single crystal substrate and also using a metalorganic material (DMZn) containing no oxygen that has high reactivity with Water vapor even at a low temperature.

FIG. 19, FIG. 20 and FIG. 21 show AFM images of a surface of the ZnO substrate, a surface of the low-temperature growth ZnO single crystal buffer layer grown by the method according to the second embodiment, and a surface of the buffer layer after annealing (900° C., 10 min). On the surface of the ZnO substrate, a terrace of steps associated with a c-plane 0.5°-off substrate (0.5° to an m-axis direction) can be observed. The surface of the buffer layer after the growth (before the annealing) (FIG. 20) corresponds to a layer having a domain of a size of 100 to 200 nm. Furthermore, an RHEED image showed a streak pattern indicating excellent flatness and single-crystallinity. The buffer layer was changed to a thermostable crystal by annealing, and a bilayer step-and-terrace having a width corresponding to a substrate off-angle which are better than the substrate surface (FIG. 19) were observed. Moreover, since the RHEED image was also changed to a streak pattern having a narrower line width by annealing, it was confirmed that flatness and single-crystallinity were improved.

Figure 22:
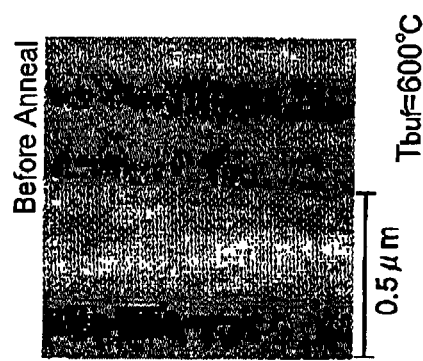
FIG. 22 shows an AFM image of a surface of a growth layer (before annealing) when a ZnO crystal layer is grown on the buffer layer (a growth temperature: 500° C.)
Figure 23:
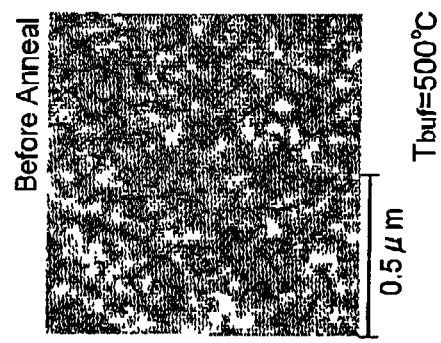
FIG. 23 shows an AFM image of a surface of a growth layer (before annealing) when a ZnO crystal layer is grown on the buffer layer (a growth temperature: 600° C.)

Additionally, each of FIG. 22 and FIG. 23 shows an AFM image of the growth layer surface (before annealing) when a growth temperature of the buffer layer was set to 500° C. or 600° C. and the ZnO single crystal layer was grown on the buffer layer. It is to be noted that the growth was performed by the same method as that in the second embodiment except the growth temperature of the buffer layer. As can be understood from a surface state shown in each AFM image, when the growth temperature is not lower than 500° C., thermal stabilization of the ZnO crystal (the buffer layer) advances, and a buffer layer function is reduced. In particular, it can be understood that the thermostable-state ZnO crystal grows at 600° C.

As described above, the quasi-thermostable-state ZnO single crystal having an excellent buffer layer function can be formed based on growth under conditions of a low temperature (a low growth temperature), a low pressure (a low growth pressure) and a low growth rate.

(2) Growth of Crystal Layer of Thermostable State

Usually, when a ZnO-based crystal layer is grown at a high temperature (e.g., 500° C. or above), an irregular or uneven surface having a columnar shape, a plate-like shape or domains is obtained as described in conjunction with the comparative example. In the foregoing embodiments, the low-temperature growth buffer layer was formed, and then the thermostable-state ZnO single crystal having excellent flatness was successfully grown under high-temperature growth conditions.

To grow a thermostable single crystal having excellent flatness, a growth start surface in a state that a cleanness factor of a crystal growth surface is high and migration of a chemical species (e.g., water vapor, a metalorganic compound, or decomposed intermediates thereof) is not obstructed must be prepared as a first factor, chemical species concerning growth react on a substrate surface as a second factor, and the chemical species concerning growth grow in a process that they migrate on the crystal surface and are placed at crystal stable sites to be crystallized (a two-dimensional crystal growth process) as a third factor.

In the present invention, the first factor was solved by the quasi-thermostable single crystal buffer layer as described above. Furthermore, the second and third factors were solved by using the water vapor and the metalorganic compound containing no oxygen in molecules as crystal growth materials.

More specifically, a clean surface (i.e., the growth start surface for the thermostable single crystal) having excellent flatness and single-crystallinity can be obtained by annealing the quasi-thermostable buffer layer formed based on low-temperature growth to restore crystallinity. Further, the water vapor adsorbs onto the oxide crystal surface, and the metalorganic compound attacks and reacts with the water vapor that has adsorbed to the crystal surface. The chemical species migrates to be placed at the crystal stable site through this process. As a result, the crystal having excellent flatness and crystal orientation can be grown.

(3) Buffer Layer (First Growth Layer) and ZnO Single Crystal Layer (Second Growth Layer) According to Embodiment

(3.1) Buffer Layer and ZnO Single Crystal Layer According to First Embodiment There is the first embodiment as an example showing an excellent function of the single-crystal buffer layer. As indicated by a (002)2θ measurement result of the XRD shown in FIG. 10, the ZnO crystal layer (the second growth layer) according to the first embodiment is a layer having an expanded a-axis and a contracted c-axis. Furthermore, an FWHM of (100)ω is 180 arcsec and wider than the FWHM (120 arcsec) according to the comparative example, and the crystal that has poor crystal orientation and a relatively high defect/dislocation density but has very excellent flatness is provided.

The growth of a ZnO-based crystal is greatly dependent on a state of the growth start surface. As described above, forming a surface that is clean and does not obstruct migration of a chemical species is important to grow a thermostable-state ZnO-based crystal layer having excellent flatness. In other words, the ZnO single crystal buffer layer according to the first embodiment provides the clean surface having excellent flatness and single-crystallinity (the growth start surface).

Meanwhile, lattice deviation of the ZnO layer (the second growth layer) according to the first embodiment occurred due to formation of a denatured or degenerated crystal by the single-crystal buffer layer and substrate surface deposits. For example, if an Li or Si contained in the ZnO substrate has adhered on the substrate surface, a crystal of ZnLiO or ZnSiO is generated. That is, the single-crystal buffer layer is superior in a function of containing, as solid solution, impurities such as Li or Si that have adhered to the surface, and it has a function of growing a ZnO-based crystal layer having high flatness.

It is to be noted that almost all of a buffer layer of a GaN-based crystal on a sapphire substrate is evaporated by a heat treatment to leave single crystal nucleuses and lateral growth is performed based on the nucleuses whereas a ZnO buffer layer on the sapphire substrate and the ZnO substrate is not evaporated at all even though a heat treatment is carried out. Therefore, as a phenomenon intrinsic to growth of a ZnO-based crystal, a ZnO-based single crystal layer having high flatness cannot be grown on a buffer layer at a high temperature unless the buffer layer itself is an excellent single crystal.

(3.2) Buffer Layer (First Growth Layer) and ZnO Single Crystal Layer (Second Growth Layer) According to Second and Third Embodiments As different from the first embodiment, the ZnO layer (the second growth layer) formed on the buffer layer according to the second or third embodiment demonstrated very excellent crystal orientation, i.e., 26 arcsec (FIG. 15) or 28.5 arcsec as an FWHM of XRD (100)ω without lattice deviation (FIG. 15). That is, this is an outcome of removing, e.g., deposits on the substrate surface by substrate etching and avoiding crystal denaturalization or degeneration of the single-crystal buffer layer. Therefore, surface deposits and the like on the ZnO single crystal substrate can be easily removed by etching to avoid crystal denaturalization of the single-crystal buffer layer. As a result, the ZnO-based crystal layer having excellent flatness and crystal orientation can be grown.

Figure 24:
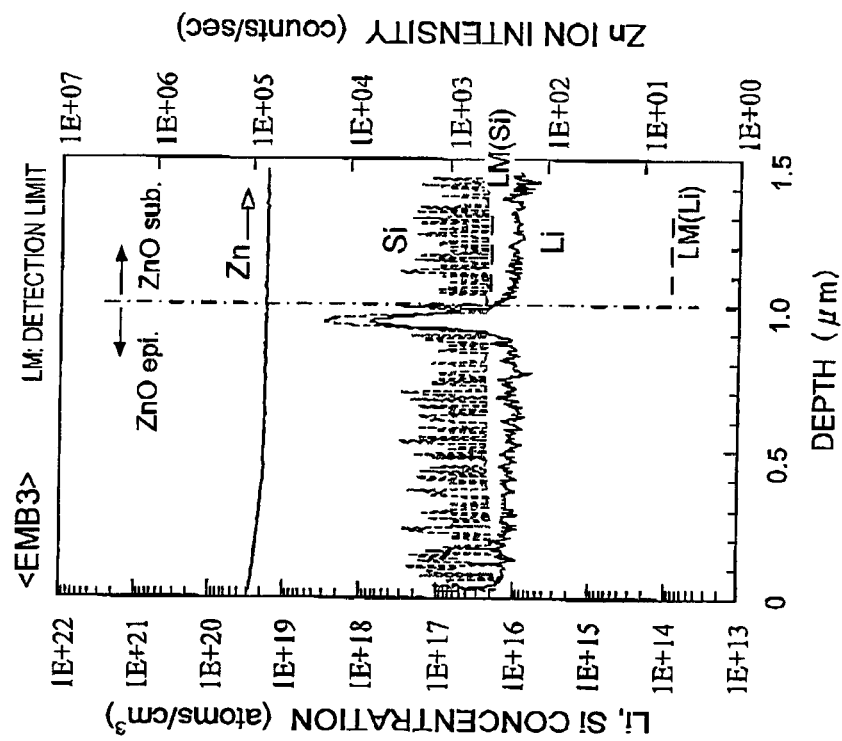
FIG. 24 shows an SIMS measurement result of the growth layer in a depth direction according to the second embodiment of the invention.
Figure 25:
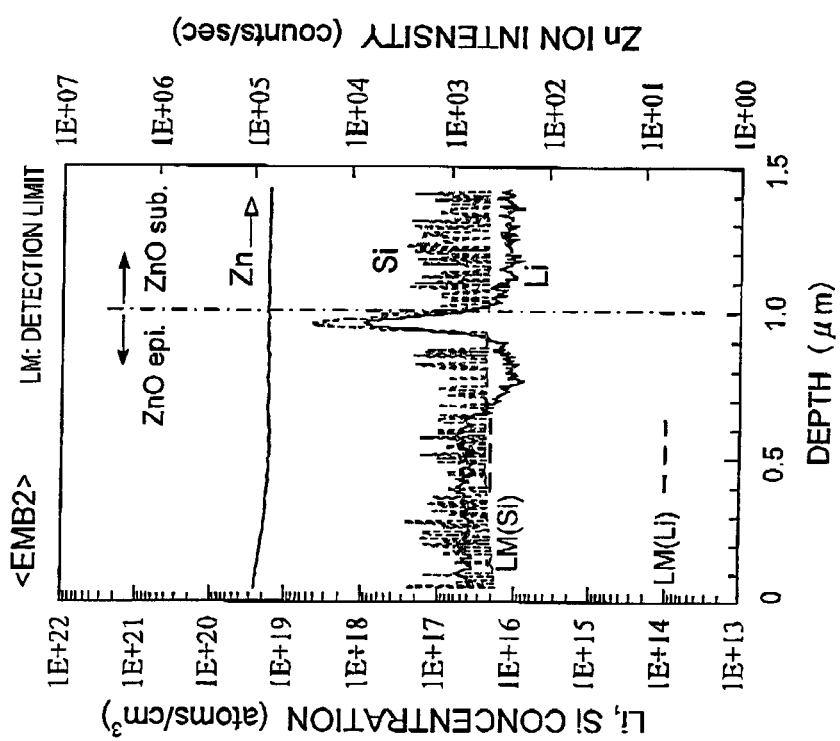
FIG. 25 shows an SIMS measurement result of the growth layer in a depth direction according to the third embodiment of the invention.

FIG. 24 and FIG. 25 show SIMS measurement results of the growth layers in the depth direction in the second and third embodiments, respectively, which show depth-direction profiles of concentrations of Li (lithium) and Si (silicon). It can be recognized that each of Li and Si is accumulated (or piled up) in an interface region (i.e., in the growth layer in the proximity of the interface) between the ZnO substrate and the ZnO single crystal layer with a high concentration. On the other hand, a concentration of an impurity in the ZnO growth layer was approximately equal to that in the substrate. Based on the SIMS results, it can be understood that the impurity or deposits remained even though the substrate etching was performed were effectively solved or contained in the single-crystal buffer layer (i.e., to produce solid solution) and that the ZnO growth layer has the same crystal quality as the substrate since an impurity concentration in the Zn oxide layer is substantially equal to that in the substrate.

Figure 26:
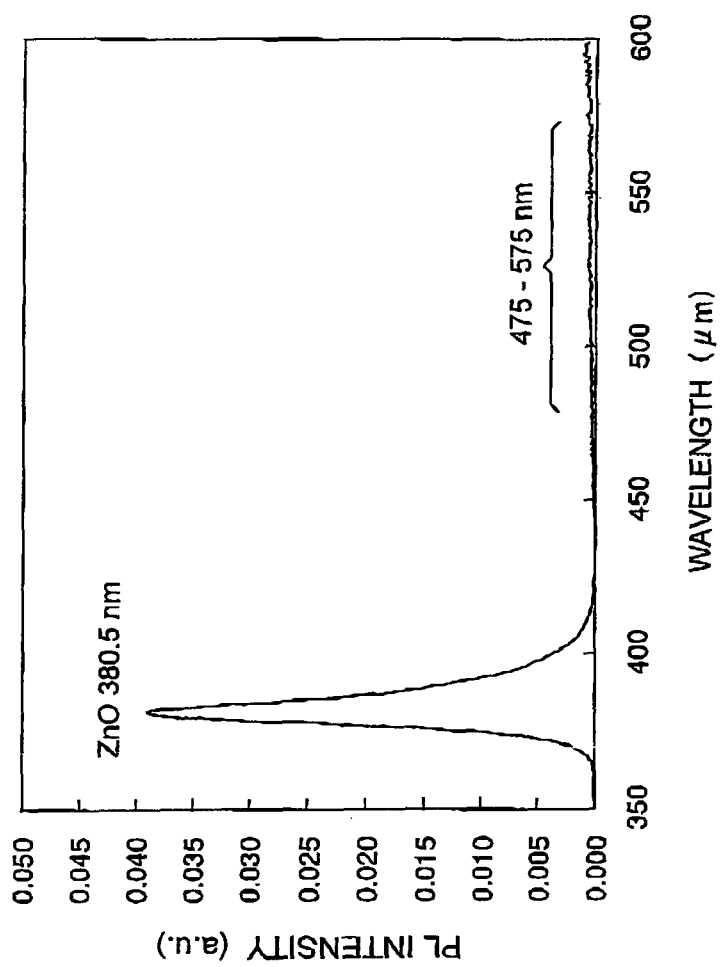
FIG. 26 is a view showing a PL measurement result of the growth layer according to the second embodiment of the invention.

Further, FIG. 26 shows a PL (Photoluminescence) measurement result of the growth layer according to the second embodiment. It can be understood that, since crystal orientation of the ZnO growth layer was improved by the etching treatment, a defect/dislocation density was reduced, and deep-level luminescence (approximately in a wavelength range of 475 to 575 nm) caused due to an oxygen defect or deficiency called a green band was thereby suppressed. Additionally, a luminescence intensity ratio of a deep level luminescence with respect to band edge luminescence (380.5 nm) of a PL spectrum (a D/P ratio: Deep/Peak ratio) was reduced to 0.02. It is to be noted that the D/P ratio of the ZnO layer manufactured by the method according to the embodiments had an excellent value that is less than 0.05. Accordingly, for, example, a light-emission efficiency of the light-emission layer in a light emitting device can be improved by a high-quality crystal that has no deep level or has a suppressed deep level. Further, p-type conductivity control can be facilitated, i.e., formation of a p-type ZnO-based semiconductor layer can be also facilitated,

[Crystal Growth Conditions]
1. Buffer Layer (First Growth Layer) Forming Conditions
1.1 Growth Temperature As a growth temperature, a value in the range of 250° C. to 450° C. is appropriate. A temperature of 300° C. to 400° C. is preferable. A polycrystalline state is apt to be provided if the growth temperature is not greater than 250° C., and a thermostable state advances and a buffer function is lost if the growth temperature is not lower than 450° C., which is not desirable.

1.2 Growth Pressure

As a growth pressure, a value in the range of 1 kPa to 30 kPa is appropriate, and a value in the range of 5 kPa to 20 kPa is preferable. If the pressure is not greater than 1 kPa, a growth rate is considerably lowered, which is not practical. Furthermore, irregularities of the crystal surface are increased when the pressure is not lower than 30 kPa (an RMS roughness value is increased).

1.3 Growth Rate

As a growth rate, a value in the range of 0.4 to 9.0 nm/min is appropriate. A value in the range of 0.4 to 4 nm/min is preferable. If the growth rate is less than 0.4 nm/min, a growth time becomes not smaller than one hour, thereby degrading a production efficiency. Moreover, if the growth rate is not lower than 9.0 nm/min, irregularities of the surface are increased, and a time required for flattening prolongs in a heat treatment process. Additionally, sufficient flatness may not be obtained.

1.4 VI/II ratio or $F_{H2O}/F_{DMZn}$ ratio

A good VI/II ratio as a flow ratio of a water vapor flow rate and a metalorganic (DMZn) flow rate is approximately 2 or above, and approximately 70% of a saturated water vapor amount with which vapor is not aggregated in the second RUN line or the shower head is appropriate as an upper limit. Practically, approximately 2000 is sufficient.

1.5 Growth Layer Thickness

As a growth layer thickness, approximately 5 to 60 nm is appropriate, and 10 to 40 nm is preferable. An optimum range is 15 to 30 nm. If the growth layer thickness is less than 5 nm, the buffer layer may not sufficiently cover the substrate in some cases. Further, if the growth layer thickness is not lower than 60 nm, transition to the thermostable state becomes difficult in the annealing process.

1.6 Surface Roughness (RMS)

As surface RMS roughness (root mean square roughness) of the formed single crystal buffer layer, 2 nm or below in a region of 1 $\mu m^2$ is appropriate, and 1 nm or below is preferable. That is because, if flatness is excellent at the buffer layer forming stage, flatness after annealing can be also improved.

1.7 Restoration of Crystallinity of Buffer Layer

As an annealing temperature for the buffer layer, a temperature that is greater than or equal to 700° C. and less than or equal to 1000° C. is appropriate. A range of 800° C. to 900° C. is preferable. If crystallinity cannot be sufficiently restored if the annealing temperature is too low, and crystallinity is decreased if the annealing temperature is too high. Additionally, approximately 10 minutes or below is sufficient as an annealing time.

As the surface RMS roughness after a heat treatment, a value that is not greater than 1 nm in a region of 1 $\mu m^2$ is appropriate. It is to be noted that a minimum step of the c-plane ZnO crystal is 0.5207 nm that is equal to a c-axis length because of a bilayer unit.

2. ZnO-Based Crystal Layer (Second Growth Layer) Forming Conditions 2.1 Growth Temperature As a growth temperature, 600° C. or higher at which the growth surface is flattened is appropriate, and an upper limit of the growth temperature is 900° C. that is a growth upper limit temperature when using H$_2$O (water vapor). Preferably, a temperature range that is –20° C. to –200° C. of the growth upper limit temperature is appropriate. In this temperature range, flatness of the growth temperature is excellent, and a growth rate is not reduced.

2.2 Growth Pressure

To obtain the ZnO-based crystal layer, 20 kPa or above is good and 40 kPa or above is preferable as a growth pressure. When the growth atmospheric pressure is lowered, the growth rate is reduced. In particular, when the high-temperature growth is performed and 20 kPa or below is set, the growth rate is extremely reduced. Although an upper limit of this pressure was set to approximately 120 kPa as a high-pressure sealing performance upper limit of the apparatus, growth was performed without problem.

2.3 Growth Rate

As a growth rate, a range of 0.1 nm/min to 70 nm/min is appropriate. When growing an n-type ZnO-based crystal layer, a light-emission layer or a p-type ZnO-based crystal layer, a growth rate can be selected to meet a purpose such as a function of each layer (a QW layer, a current diffusion layer, ...), impurity concentration control or residual carrier density control.

For example, a range of 1 nm/min to 10 nm/min can be selected for the purpose of improving crystal orientation on the initial stage of growth on the ZnO substrate, approximately 50 nm/min may be selected for growing an n-type ZnO-based layer, and a range of 0.1 nm/min to 1 nm/min can be selected for the purpose of suppressing a residual carrier density in the light-emission layer.

2.4 VI/II Ratio or $F_{H2O}/F_{DMZn}$ Ratio

A good VI/II ratio as a flow ratio of a water vapor flow rate and a metalorganic (DMZn) flow rate is approximately 2 or above. However, as an upper limit of the water vapor flow rate, approximately 70% of a saturated water vapor amount with which vapor is not aggregated in the second RUN line 29R or the shower head 30 is good. Practically, approximately 2000 is sufficient as the VI/II ratio.

2.5 Crystal Composition and Doping

As the ZnO-based crystal, a $Mg_xZn_{(1-x)}O$ ($0 \leq x \leq 0.68$) crystal can be used. It is to be noted that a metalorganic material such as Cp2Mg can be used in order to grow a MgZnO crystal. Further, an organic metal such as TEGa can be used as a dopant to provide an n-type layer, and NH$_3$ or the like can be used in order to provide a p-type layer. It is to be noted that approximately 10 nm to 50 nm thickness of a ZnO crystal layer preferably be formed after start of growth on the single-crystal buffer layer in order to stabilize the growth.

Additionally, the ZnO-based crystal may be any other ZnO-based compound crystal beside MgZnO. For example, a ZnO-based compound crystal in which a part of Zn (zinc) is substituted by calcium (Ca) may be used. Alternatively, a ZnO-based compound crystal in which a part of O (oxygen) is substituted by selenium (Se), sulfur (S) or tellurium (Te) may be used.

[Semiconductor Device]

FIG. 27 shows a stacked or layered structure of a device-layer-formed substrate 70 that is used for manufacture of a ZnO-based semiconductor light emitting device (LED: a light emitting diode) as an example that the present invention is applied to a semiconductor device. It is to be noted that the "device layer" used herein means a layer formed of a semiconductor that should be included for serving a function of a semiconductor device. For example, in case of a simple transistor, a structural layer constituted of pn junction of an n-type semiconductor and a p-type semiconductor is included. Further, a semiconductor structural layer that is formed of an n-type semiconductor layer, a light-emission layer and a p-type semiconductor layer to perform a light emitting operation based on recombination of injected carriers is called a light emitting device layer in particular.

As shown in FIG. 27, an LED-device-layer-formed substrate 78 is constituted of a buffer layer 71 formed on a ZnO single crystal substrate 70 and a device layer 75 formed on the buffer layer 71. The device layer 75 is formed of an n-type ZnO-based semiconductor layer 72, a light-emission layer 73 and a p-type ZnO-based semiconductor layer 74. Furthermore, the n-type ZnO-based semiconductor layer 72 is constituted of a first n-type ZnO-based semiconductor layer 72A for improving crystallinity at the start of growth, a second n-type ZnO-based semiconductor layer 72B as a current diffusion layer, and a third n-type ZnO-based semiconductor layer 72C that functions as a hole barrier. Likewise, the p-type ZnO-based semiconductor layer 74 is formed of a first p-type ZnO-based semiconductor layer 74A that functions as an electron barrier and a second p-type ZnO-based semiconductor layer 74B that reduces a contact resistance with respect to an electrode. It is to be noted that the buffer layer 71 and the ZnO-based semiconductor layer 72A as a crystal layer on the buffer layer 71 are formed by the same method as that in the second embodiment.

The semiconductor laminated structure of the device layer 75 can be formed based on the growth method according to each of the embodiments or by appropriately modifying the growth method. For example, like the growth sequence and the growth conditions in the growth method according to the embodiments, a material gas, a dopant gas and the like can be changed to sequentially grow each semiconductor layer. Furthermore, a composition (or a band gap), a layer thickness, a conductivity type, a doping concentration (or a carrier concentration) and the like of each semiconductor layer can be appropriately modified or selected in accordance with, e.g., necessary characteristics of the semiconductor light emitting device. For example, an undoped ZnO layer can be adopted in place of the first n-type ZnO-based semiconductor layer 72A. Further, it is possible to form, for example, a Ga doped ZnO layer as the second n-type ZnO-based semiconductor layer 72B, a Ga doped $Mg_xZn_{1-x}O$ layer as the third n-type ZnO-based semiconductor layer 72C, a quantum well (QW) light-emission layer including a ZnO layer and a $Mg_xZn_{1-x}O$ layer as the light-emission layer 73, a nitrogen (N) doped $Mg_xZn_{1-x}O$ layer as the first p-type ZnO-based semiconductor layer 74A, and a nitrogen (N) doped ZnO layer as the second p-type ZnO-based semiconductor layer 74B.

It is to be noted that, when forming, e.g., the n-type ZnO-based semiconductor layer 72 by the method according to the present invention, one or more impurities selected from Al (aluminum), Ga (gallium) and In (indium) are added as n-type impurities. According to the present invention, the added impurities do not diffuse into other layers since a defect/dislocation density in the ZnO-based semiconductor layer is very low. Therefore, the added impurities are not compensated, thereby increasing an activation ratio of the carrier. Accordingly, the impurities do not have to be added more than necessity, and hence crystallinity of the n-type ZnO-based semiconductor layer is not decreased.

Further, in case of a quantum well (QW) active layer, an effect of using the ZnO-based semiconductor layer having excellent flatness and single crystallinity is further prominent since a fluctuation of a layer thickness of a crystal layer (a well layer, a barrier layer) changes, e.g., quantum level energy or a quantum level density to greatly affect an emission wavelength or an internal quantum efficiency.

When an n-side electrode and a p-side electrode are formed on the LED-device-layer-formed substrate 70 to be divided into pieces by scribing and breaking, a semiconductor light emitting device (LED) can be formed.

Since the semiconductor layer according to the present invention has excellent flatness, a high accuracy can be obtained in a semiconductor process, and a fabrication yield in, e.g., cleavage or breaking yield is high.

Additionally, FIGS. 28A and 28B show a configuration of a ZnO-based semiconductor light emitting device (LED) 88 as an application example of the present invention. FIG. 28A is a top view of the semiconductor light emitting device 88, and FIG. 28B is a cross-sectional view taken along a line A-A in FIG. 28A.

The ZnO-based semiconductor light emitting device 88 has a ZnO substrate 80, a buffer layer 81 formed on the ZnO substrate 80, and an n-type ZnO-based semiconductor layer 82A, a light-emission layer 82B and a p-type ZnO-based semiconductor layer 82C configuring a device layer 82. Further, Ti/Au is formed as an n-side connection electrode 83 on the ZnO substrate 80, and Ni—O/Au as a p-side transparent electrode 84 is formed on the p-type ZnO-based semiconductor layer 82C and Ni/Pt/Au as a p-side connection electrode 85 is formed on the p-side transparent electrode 84. It is to be noted that the representation "X/Y" means a configuration that X is formed on the ZnO-based semiconductor layer side and Y is laminated thereon.

Since junction properties of the MgZnO-based semiconductor layer with an oxide transparent conductive film are excellent, ITO or the like can be used for the n-side connection electrode 83, $CuAlO_2$ or the like can be used for the p-side transparent electrode 84, and $Ni_2O$ or the like can be used for the p-side connection electrode 85. Adopting such a configuration enables forming a transparent semiconductor light emitting device. It is to be noted that arrows denote light projecting directions in the drawing.

Figure 29:
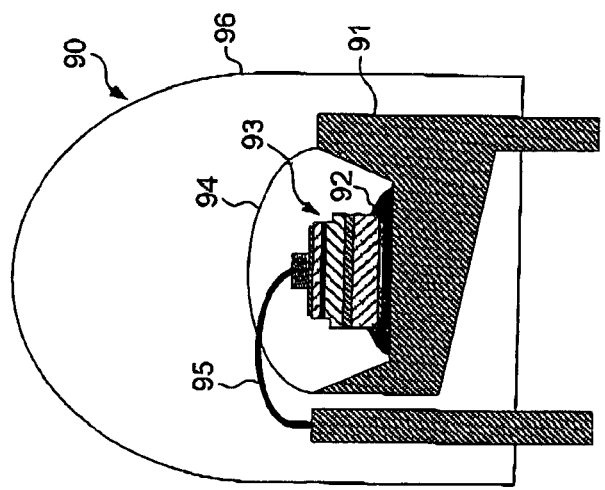
FIG. 29 is a view schematically showing a configuration of an LED lamp using a ZnO-based semiconductor light emitting device.

Additionally, FIG. 29 shows a configuration of an LED lamp 90 using a ZnO-based semiconductor light emitting device as an application example of the present invention. A ZnO-based semiconductor light emitting device 93 has the same configuration as, e.g., the ZnO-based semiconductor device 80. The ZnO-based semiconductor light emitting device 93 is secured and electrically connected to an upper side of a frame 91 through a silver paste 92. Further, the ZnO-based semiconductor light emitting device 93 is encapsulated in a fluorescent layer 94. An upper electrode of the ZnO-based semiconductor light emitting device 93 is connected to an electrode terminal 97 through a gold wire 95. These constituent elements are hermetically sealed by a resin mold 96, thereby configuring the LED lamp 90.

A refractive index of the ZnO-based semiconductor light emitting device 93 is $n_{LED}=2.0$, a refractive index of a resin of the resin mold 96 is $n_{MOLD}=1.5$ and a refractive index of air is $n_{AIR}=1.0$, thus the refractive index difference between the ZnO-based semiconductor light emitting device 93 and the resin mold 96 is 0.5, and the refractive index difference between the resin mold 96 and air is 0.5. Therefore, a light extraction efficiency from the ZnO-based semiconductor light emitting device 93 is very high, whereby ultraviolet to chromatic LEDs having a high light-emission output can be manufactured.

In the foregoing embodiments, $Mg_xZn_{(1-x)}O$ is taken as an example of the ZnO-based crystal, but any other ZnO-based compound crystal may be used. For example, a ZnO-based compound crystal in which a part of Zn (zinc) is substituted by calcium (Ca) may be used. Alternatively, a ZnO-based compound crystal in which a part of O (oxygen) is substituted by selenium (Se), sulfur (S) or tellurium (Te) may be used.

Further, although the semiconductor light emitting device (LED) has been described as an example in the foregoing embodiments, the present invention is not restricted thereto, and it can be applied to general semiconductor devices or electronic devices. For example, it can be applied to various devices, e.g., a surface acoustic wave device, an electronic device such as an MOSFET, a semiconductor laser (LD:

Laser diode), or an optical semiconductor device such as a semiconductor light receiving device.

As described above in detail, according to the present invention, the quasi-thermostable-state ZnO single crystal having excellent flatness and single-crystallinity can be grown on the ZnO single crystal substrate. Further, the buffer layer having crystallinity restored (i.e., transition to the thermostable state) by annealing is further superior in flatness and single-crystallinity and has excellent functions or capabilities as the buffer layer. There can be obtained an excellent effect that the ZnO single crystal of the thermostable state that is superior in flatness/crystal orientation and has a low defect and dislocation density and high integrity can be formed under the high-temperature growth conditions by using the buffer layer.

Therefore, in application to a semiconductor device and the like, excellent impurity concentration control, impurity concentration profile control and abrupt interface control can be carried out, and a high-quality crystal multi-layered configuration can be provided, whereby a semiconductor device having excellent characteristics can be provided. Moreover, a ZnO-based crystal semiconductor light emitting device having excellent electrical characteristics and high-performance, for example, a high light-emission efficiency.

Additionally, the p-type conductivity control that is important when realizing the ZnO-based semiconductor device can be overcome. That is, a problem that a carrier (i.e., a hole) of a positive charge produced due to a p-type impurity is compensated by defects or dislocation can be solved, thereby obtaining a p-type crystal having excellent conductivity.

Therefore, according to the present invention, the ZnO-based crystal that has excellent flatness and crystal orientation and a low defect and dislocation density can be grown, and a semiconductor device such as a high-performance high-yield semiconductor light emitting device having excellent electrical characteristics, optical characteristics and the like can be manufactured.

The invention has been described with reference to the preferred embodiments thereof. It should be understood by those skilled in the art that a variety of alterations and modifications may be made from the embodiments described above. It is therefore contemplated that the appended claims encompass all such alterations and modifications.

This application is based on Japanese Patent Application No. 2009-125495 which is hereby incorporated by reference.

What is claimed is:

1. A method for growing a ZnO-based crystal layer on a substrate of a zinc oxide (ZnO) single crystal by an MOCVD method, said method comprising:
    a low-temperature growth step of growing a ZnO-based single crystal buffer layer on said substrate at a growth temperature in the range of 250° C. to 450° C. using a polar oxygen material and a metalorganic compound containing no oxygen, wherein a growth pressure in said low-temperature growth step falls within the range of 1 kPa to 30 kPa, and a growth rate of said ZnO-based single crystal buffer layer falls within the range of 0.4 nm/min to 9.0 nm/min;
    a step of performing a heat treatment of said ZnO-based single crystal buffer layer to effect a transition of said ZnO-based single crystal buffer layer to a thermostable-state ZnO-based single crystal buffer layer; and
    a high-temperature growth step of growing said ZnO-based single crystal layer on said thermostable-state ZnO-based single crystal buffer layer at a growth temperature in the range of 600° C. to 900° C. using the polar oxygen material and the metalorganic compound containing no oxygen,
    wherein said buffer layer produces a solid solution with an impurity included in said substrate, and wherein a concentration of the impurity in said buffer layer is larger than a concentration of the impurity in said substrate.

2. The method according to claim 1, wherein the growth temperature in said high-temperature growth step is a temperature that is 20° C. to 200° C. lower than a growth upper limit temperature of said ZnO-based single crystal layer.

3. The method according to claim 1, wherein a temperature of said heat treatment for said buffer layer falls within the range of 700° C. to 1000° C.

4. The method according to claim 1, wherein said polar oxygen material contains at least one of water vapor and lower alcohols.

5. The method according to claim 1, further comprising a step of etching a surface of said substrate for growing said buffer layer.

6. The method according to claim 1, wherein said buffer layer has a layer thickness in the range of 5 nm to 60 nm.

7. The method according to claim 1, wherein a growth rate of said ZnO-based single crystal layer is in the range of 0.1 nm/min to 70 nm/min.

8. The method according to claim 1, wherein said substrate is a c-plane ZnO single crystal substrate.

9. The method according to claim 1, wherein said ZnO-based single crystal layer is a $Mg_xZn_{(1-x)}O$ ($x \leqq 0.68$) layer.

10. The method according to claim 1, further comprising a step of growing a device layer on said ZnO-based single crystal layer that is grown in said high-temperature growth step, said device layer including at least one of an n-type ZnO-based semiconductor layer and a p-type ZnO-based semiconductor layer.

11. The method according to claim 10, wherein said at least one of the n-type ZnO-based semiconductor layer and the p-type ZnO-based semiconductor layer is a $Mg_xZn_{(1-x)}O$ ($x \leqq 0.68$) layer.

12. The method according to claim 10, wherein said device layer includes the p-type ZnO-based semiconductor layer.

13. The method according to claim 10, wherein said device layer is an LED device layer including an n-type ZnO-based single crystal layer, a light-emission layer and a p-type ZnO-based single crystal layer.

14. A semiconductor device manufactured by forming ZnO-based semiconductor layers on a substrate of a ZnO single crystal by an MOCVD method, said semiconductor device comprising:
    a ZnO-based single crystal buffer layer grown on said substrate at a growth temperature in the range of 250° C. to 450° C. using a polar oxygen material and a metalorganic compound containing no oxygen, wherein said ZnO-based single crystal buffer layer is grown at a growth rate that falls within the range of 0.4 nm/min to 9.0 nm/min, and under a growth pressure that falls within the range of 1 kPa to 30 kPa, and wherein said ZnO-based single crystal buffer layer is subject to a heat treatment after the growth to effect a transition of said ZnO-based single crystal buffer layer to a thermostable-state ZnO-based single crystal buffer layer;
    a ZnO-based semiconductor layer grown on said thermostable-state ZnO-based single crystal buffer layer at a growth temperature in the range of 600° C. to 900° C. using the polar oxygen material and the metalorganic compound containing no oxygen, and a device layer grown on said ZnO-based semiconductor layer, said device layer including at least one of an n-type ZnO-based semiconductor layer and a p-type ZnO-based semiconductor layer, wherein said buffer layer produces a solid solution with an impurity included in said substrate, and wherein a concentration of the impurity in said buffer layer is larger than a concentration of the impurity in said substrate.

15. The semiconductor device according to claim 14, wherein said ZnO-based semiconductor layer is grown at a temperature that is 20° C. to 200° C. lower than a growth upper limit temperature of said ZnO-based semiconductor layer.

16. The semiconductor device according to claim 14, wherein said buffer layer has undergone the heat treatment in the range of 700° C. to 1000° C.

17. The semiconductor device according to claim 14, wherein said buffer layer has a layer thickness in the range of 5 nm to 60 nm.

18. The semiconductor device according to claim 14, wherein said device layer is an LED device layer including an n-type ZnO-based single crystal layer, a light-emission layer and a p-type ZnO-based single crystal layer.

19. A ZnO-based single-crystal-layer-formed substrate, comprising:
    a ZnO-based single crystal substrate containing at least one of Al, Li and Si as an impurity at a predetermined concentration; and
    a buffer layer grown on said substrate, said buffer layer being a thermostable-state ZnO-based single crystal layer,
    wherein said buffer layer produces a solid solution with the impurity when measurement is performed based on SIMS (secondary ion mass spectroscopy); and
    wherein a concentration of the impurity in the ZnO-based single crystal layer is lower than the predetermined concentration when the measurement is performed based on the SIMS.

* * * * *